(12) United States Patent
Horikawa et al.

(10) Patent No.: US 8,419,442 B2
(45) Date of Patent: Apr. 16, 2013

(54) SOCKET AND METHOD OF FABRICATING THE SAME

(75) Inventors: Yasuyoshi Horikawa, Nagano (JP); Yoshihiro Ihara, Nagano (JP); Kenji Mochizuki, Nagano (JP); Masato Tanaka, Nagano (JP)

(73) Assignee: Shinko Electric Industries Co., Ltd., Tokyo (JP)

( * ) Notice: Subject to any disclaimer, the term of this patent is extended or adjusted under 35 U.S.C. 154(b) by 0 days.

(21) Appl. No.: 13/183,975

(22) Filed: Jul. 15, 2011

(65) Prior Publication Data

US 2012/0021625 A1  Jan. 26, 2012

(30) Foreign Application Priority Data

Jul. 20, 2010  (JP) ................................. 2010-163141

(51) Int. Cl.
*H01R 12/00* (2006.01)
(52) U.S. Cl.
USPC .......................................................... 439/71
(58) Field of Classification Search .................... 439/71, 439/66
See application file for complete search history.

(56) References Cited

U.S. PATENT DOCUMENTS

| 5,772,451 | A | 6/1998 | Dozier, II et al. |
| 5,917,707 | A | 6/1999 | Khandros et al. |
| 5,974,662 | A | 11/1999 | Eldridge et al. |
| 6,049,976 | A | 4/2000 | Khandros |
| 6,336,269 | B1 | 1/2002 | Eldridge et al. |
| 6,669,489 | B1 * | 12/2003 | Dozier et al. ................... 439/71 |
| 6,957,963 | B2 * | 10/2005 | Rathburn ....................... 439/66 |
| 7,264,486 | B2 | 9/2007 | Ma |
| 7,371,073 | B2 | 5/2008 | Williams |

FOREIGN PATENT DOCUMENTS

| JP | 3157134 | 4/2001 |
| WO | WO 95/14314 | 5/1995 |

* cited by examiner

*Primary Examiner* — Phuong Dinh
(74) *Attorney, Agent, or Firm* — IPUSA, PLLC

(57) ABSTRACT

A socket detachably connects a connecting item to a substrate via connecting terminals. The socket includes a support member with first and second surfaces to fix the connecting terminals, and penetrating holes formed in the support member. Each connecting terminal includes first and second connecting parts formed on opposite ends thereof. Each connecting terminal is inserted into a corresponding penetrating hole in a state in which the first connecting part is fixed to the first surface and the second connecting part projects from the second surface of the support member.

11 Claims, 28 Drawing Sheets

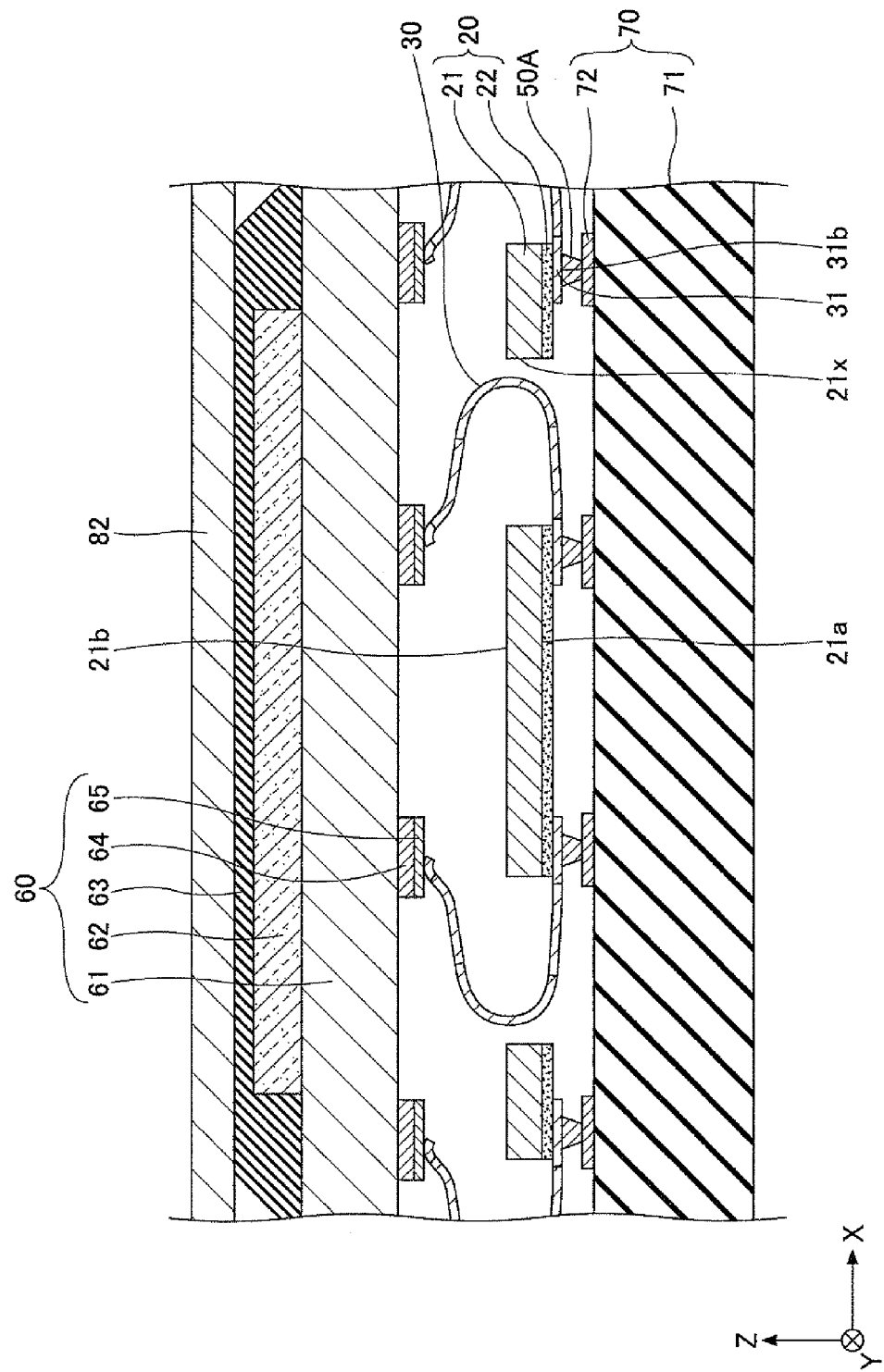

SOCKET AND METHOD OF FABRICATING THE SAME

CROSS-REFERENCE TO RELATED APPLICATIONS

This application is based upon and claims the benefit of priority of the prior Japanese Patent Application No. 2010-163141, filed on Jul. 20, 2010, the entire contents of which are incorporated herein by reference.

BACKGROUND OF THE INVENTION

1. Field of the Invention

The present invention relates to a socket configured to electrically connect a connecting item, such as a semiconductor package, to a substrate, such as a circuit board, and to a method of fabricating such a socket.

2. Description of the Related Art

Conventionally, there is a socket configured to electrically connect a connecting item to a circuit board or the like. FIG. 1 is a cross sectional view illustrating a first example of a conventional socket. As illustrated in FIG. 1, a conventional socket 100 includes a support member 101, and conductive connecting terminals 102 and 103 that are flexible and have a spring property. A plurality of through holes 101x are arranged at a predetermined pitch in the support member 101. A wiring 104 is formed on one surface 101a of the support member 101, and the wiring 104 extends from the one surface 101a to another surface 101b of the support member 101 via the through hole 101x.

One end of the connecting terminal 102 is fixed to the wiring 104 formed on the one surface 101a of the support member 101. The other end of the connecting terminal 102 may contact a pad 401 of a connecting item 400. For example, the connecting item 400 may be a wiring board, a semiconductor package, and the like. One end of the connecting terminal 103 is fixed to the wiring formed on the other surface 101b of the support member 101. The other end of the connecting terminal 103 is electrically connected to a circuit board 500, such as a mother board. The connecting terminals 102 and 103 may be formed by identical parts.

When the connecting item 400 is pushed towards the socket 100 with the pad 401 facing the socket 100, the other end of the connecting terminal 102 makes contact with the pad 401 to electrically connect the socket 100 and the connecting item 400. In other words, the connecting item 400 is electrically connected to the circuit board 500 via the socket 100, as proposed in a U.S. Pat. No. 7,371,073, for example.

FIG. 2 is a cross sectional view illustrating a second example of the conventional socket. In FIG. 2, those parts that are the same as those corresponding parts in FIG. 1 are designated by the same reference numerals. As illustrated in FIG. 2, a conventional socket 200 includes conductive connecting terminals 202 in place of the connecting terminals 102 of the socket 100 illustrated in FIG. 1. The connecting terminals 202 are flexible and have a spring property. One end of the connecting terminal 202 is fixed to the wiring 104 formed on one surface 101a of the support member 101. The other end of the connecting terminal 202 may connect to the pad 401 of the connecting item 400. Unlike the socket 100 illustrated in FIG. 1, the socket 200 includes bumps 203 in place of the connecting terminals 103. The wiring 104 formed on the other surface 101b of the support member 101 is electrically connected to the circuit board 500 via the bump 203.

When the connecting item 400 is pushed towards the socket 200 with the pad 401 facing the socket 200, the other end of the connecting terminal 202 makes contact with the pad 401 to electrically connect the socket 200 and the connecting item 400. In other words, the connecting item 400 is electrically connected to the circuit board 500 via the socket 200, as proposed in a Japanese Patent No. 3157134, for example.

FIG. 3 is a cross sectional view illustrating a third example of the conventional socket. In FIG. 3, those parts that are the same as those corresponding parts in FIG. 1 are designated by the same reference numerals. As illustrated in FIG. 3, a conventional socket 300 includes a housing 301 made of a resin, and conductive connecting terminals 302 that have a spring property.

A plurality of penetrating holes 301x are arranged at a predetermined pitch in the housing 301. The connecting terminal 302 includes connecting parts 315 and 316 and a spring part 317 that are integrally formed, and is fixed or fit within the penetrating hole 301x in the housing 301. The connecting part 315 projects from one surface 301a of the housing 301, and the connecting part 316 is exposed from the other surface 301b of the housing 301.

The connecting part 316 is electrically connected to the circuit board 500 via a bump 303. When the connecting item 400 is pushed towards the socket 300 with the pad 401 facing the socket 300, the connecting part 315 makes contact with the pad 401 to electrically connect the socket 300 and the connecting item 400. In other words, the connecting item 400 is electrically connected to the circuit board 500 via the socket 300, as proposed in a U.S. Pat. No. 7,264,486, for example.

In the socket 100 illustrated in FIG. 1, the connecting terminals 102 and 103 are respectively formed on the two surfaces 101a and 101b of the support member 101. In addition, the connecting terminal 102, the wiring 104 including the wiring formed within the through hole 101x, and the connecting terminal 103 form a signal transmission path between the connecting item 400 and the circuit board 500. For this reason, as the height of the socket 100 becomes higher, the connecting distance, that is, the length of the signal transmission path, between the connecting item 400 and the circuit board 500 becomes longer. According to the socket 100 having the structure described above, it may be difficult to reduce the height of the socket 100 which in turn may interfere with high-speed signal propagation.

On the other hand, in the socket 200 illustrated in FIG. 2, the connecting terminal 202 is formed on one surface 101a of the support member 101. In addition, the connecting terminal 202, the wiring 104 including the wiring formed within the through hole 101x, and the bump 203 form a signal transmission path between the connecting item 400 and the circuit board 500. The height of the socket 200 may be lower than that of the socket 100 by an amount corresponding to the replacement of the connecting terminal 103 by the bump 203. Moreover, the connecting distance, that is, the length of the signal transmission path, between the connecting item 400 and the circuit board 500, may be reduced when compared to the socket 100. However, the height of the socket 200 may not be reduced considerably due to the provision of the connecting terminal 202 and the support member 101. Further, a signal from the connecting item 400 to the circuit board 500 propagates through the wiring 104 formed within the through hole 101x of the support member 101, and thus, the connecting distance, that is, the length of the signal transmission path, between the connecting item 400 and the circuit board 500, may not be reduced considerably.

In the socket 300 illustrated in FIG. 3, no wiring is formed within the penetrating hole 301 of the housing 300, and only the bump 303 and a part of the connecting terminal 302 fixed within the penetrating hole 301x make contact with the circuit board 500 and the connecting item 400. It may appear as if the height of the socket 300 may be reduced sufficiently, and that the connecting distance, that is, the length of the signal transmission path, between the connecting item 400 and the circuit board 500, may be reduced sufficiently.

However, the part of the connecting terminal 302, that is fixed or fit within the penetrating hole 301x, does not function as a spring. Only the part of the connecting terminal 302 projecting from the one surface 301a of the housing 301 may primarily function as a spring. Consequently, in order for the connecting terminal 302 to sufficiently function as a spring, the part of the connecting terminal 302, projecting from the one surface 301a, must have a sufficiently long length. In addition, in order to fix or fit the part of the connecting terminal 302 within the penetrating hole 301a, the housing 301 must be thick to a certain extent. As a result, the height of the socket 300 may not be sufficiently reduced, and the connecting distance, that is, the length of the signal transmission path, between the connecting item 400 and the circuit board 500, may not be reduced considerably.

SUMMARY OF THE INVENTION

Accordingly, it is an object in one aspect of the present invention to provide a novel and useful socket and method of fabricating the same, in which the problems described above may be suppressed.

One aspect of the present invention is to provide a socket and a method of fabricating the same, which may sufficiently reduce the height of the socket, and sufficiently reduce the connecting distance, that is, the length of the signal transmission path, between a connecting item and a circuit board.

According to one aspect of the present invention, there is provided a socket to detachably connect a connecting item to a substrate via a plurality of connecting terminals, including a support member including a first surface and a second surface and configured to fix the plurality of connecting terminals; and a plurality of penetrating holes formed in the support member, wherein each of the plurality of connecting terminals includes a first connecting part formed on one end thereof and a second connecting part formed on another end thereof, and wherein each of the plurality of connecting terminals is inserted into a corresponding one of the plurality of penetrating holes in a state in which the first connecting part is fixed to the first surface of the support member and the second connecting part projects from the second surface of the support member.

According to another aspect of the present invention, there is provided a method of fabricating a socket to detachably connect a connecting item to a substrate via a plurality of connecting terminals, wherein each of the plurality of connecting terminals includes a first connecting part formed on one end thereof and a second connecting part formed on another end thereof, and the method includes forming a plurality of penetrating holes in a support member that is configured to fix the plurality of connecting terminals; placing the support member on a jig having a plurality of openings to accommodate the plurality of connecting terminals at positions corresponding to the plurality of penetrating holes; arranging the plurality of connecting terminals so that each second connecting part is inserted into a corresponding one of the plurality of openings and each first connecting part makes contact with a first surface of the support member; fixing each first connecting part of the plurality of connecting terminals to the first surface of the support member; and removing the jig.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 20 is a cross sectional view illustrating a part of the socket illustrated in FIG. 19 on an enlarged scale;

DESCRIPTION OF THE PREFERRED EMBODIMENTS

Preferred embodiments of the present invention will be described with reference to the accompanying drawings.

In the embodiments and modifications described hereunder, it is assumed for the sake of convenience that both a semiconductor package and a support member have a rectangular shape in plan views thereof, that is, a planar shape that is rectangular. However, the planar shapes of the semiconductor package and the support member are of course not limited to the rectangular shape, and the planar shapes may be arbitrary.

First Embodiment

[Socket Structure in First Embodiment]

Figure 4:
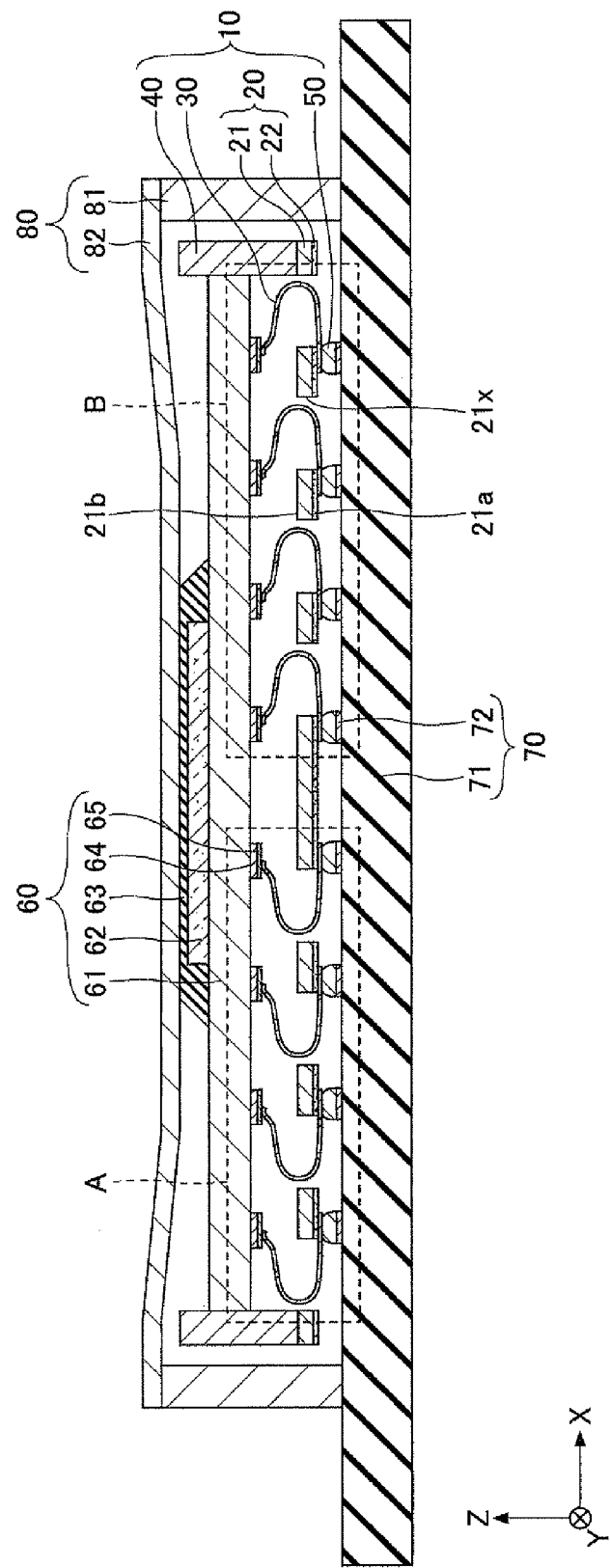
FIG. 4 is a cross sectional view illustrating a socket in a first embodiment of the present invention.
Figure 5:
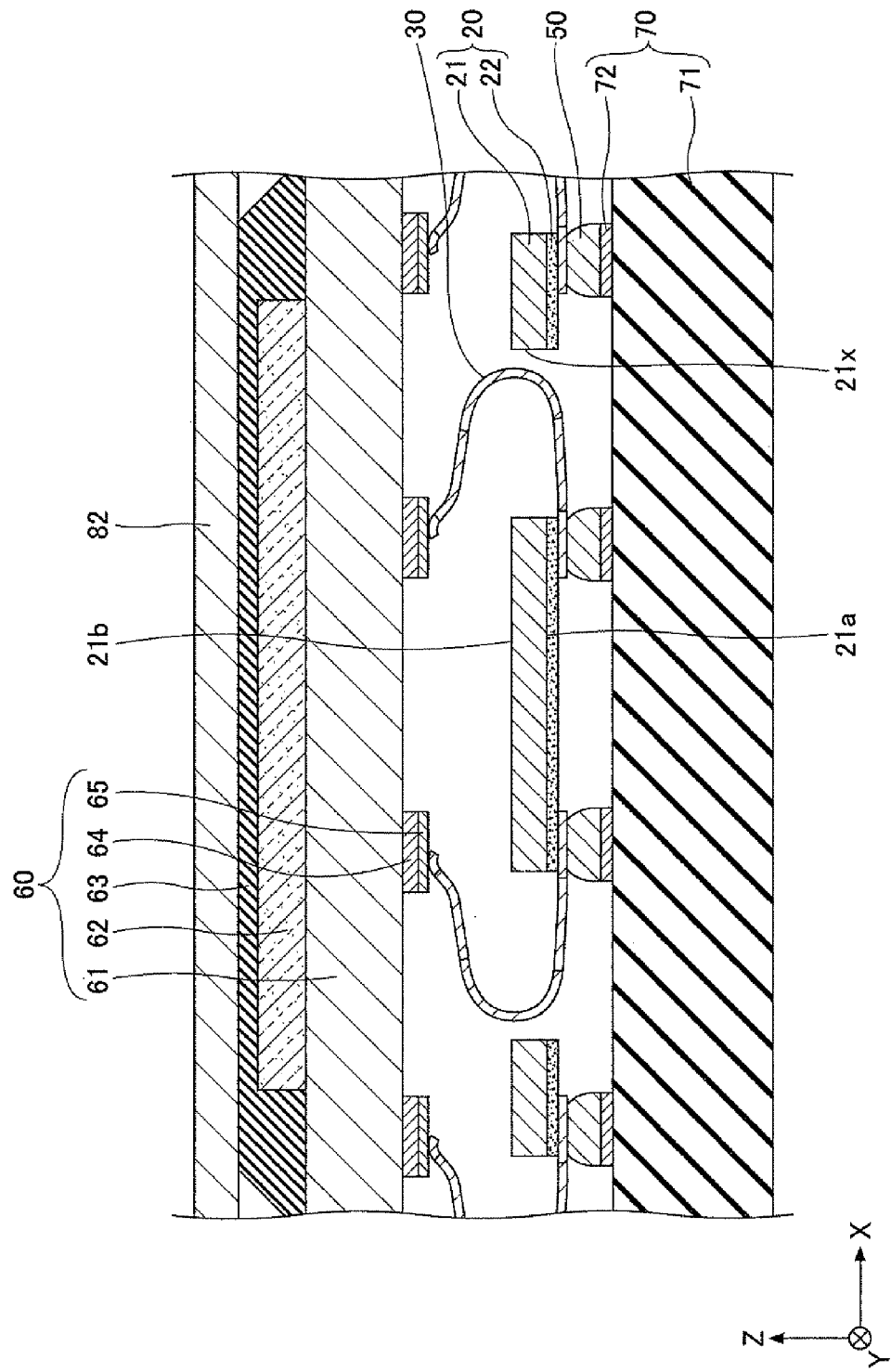
FIG. 5 is a cross sectional view illustrating a part of the socket illustrated in FIG. 4 on an enlarged scale.

FIG. 4 is a cross sectional view illustrating a socket in a first embodiment of the present invention, and FIG. 5 is a cross sectional view illustrating a part of the socket illustrated in FIG. 4 on an enlarged scale. As illustrated in FIGS. 4 and 5, a socket 10 includes a support member 20, connecting terminals 30, a positioning part 40, and bumps 50. As will be described later, the positioning parts 40 and the bumps 50 may not necessarily be essential elements of the socket 10 that includes the support member 20 and the connecting terminals 30.

A semiconductor package 60 is an example of a connecting item. The semiconductor package 60 is provided on a circuit board 70, such as a mother board, and covered by a housing 80. The semiconductor package 60 is electrically connected to the circuit board 70 via the socket 10. In this first embodiment, the semiconductor package 60 is used as an example of the connecting item, however, the connecting item may of course be formed by a wiring board or the like that does not include a semiconductor chip.

The support member 20 includes a main body 21 provided with penetrating holes 21x, and a bonding layer 22 provided on one surface 21a of the main body 21. The main body 21 is an example of a base to which the connecting terminals 30 are fixed. For example, a flexible film or substrate made of a polyimide resin, a liquid crystal polymer, and the like may be used for the main body 21. A rigid substrate formed by a glass cloth impregnated with an insulative resin such as an epoxy resin, including FR-4 (Flame Retardant Type 4) materials, may also be used for the main body 21. The thickness of the main body 21 may be 50 μm to 400 μm, and may preferably be 100 μm, for example.

The penetrating hole 21x is provided to receive the connecting terminal 30 that is inserted therein. The number of penetrating holes 21x that are provided corresponds to a number of noble metal layers (or pads) 65 provided on the semiconductor package 60 which will be described later. The planar shape of the penetrating hole 21x may be suitably determined depending on the planar shape of the connecting terminal 30. For example, the planar shape of the penetrating hole 21x may be rectangular. The main body 21, including the inside of the penetrating hole 21x, is not provided with a conductor such as a wiring pattern and a via wiring.

The bonding layer 22 is provided on the surface 21a of the main body 21 in order to fix the connecting terminal 30 to the main body 21. For example, an epoxy or silicone thermosetting bonding agent, a thermoplastic bonding agent such as a liquid crystal polymer, and the like may be used for the bonding layer 22.

The bonding layer 22 may preferably be made of a material that does not melt, even when a heating process is carried out by a solder reflow or the like during the fabrication process of the socket 10, or the bonding layer 22 reaches a high temperature due to heat generated from the semiconductor package 60 or the environmental (or ambient) temperature in which the socket 10 is used. The bonding layer 22 may be provided on the entire surface 21a of the main body 21. Alternatively, the bonding layer 22 may be provided on the surface 21a of the main body 21 only in a vicinity of a part where the connecting terminal 30 is fixed.

The connecting terminal 30 is conductive and has a spring property (or characteristic). The connecting terminal 30 is inserted into the penetrating hole 21x in the main body 21, and one end of the connecting terminal 30 (that is, one surface 31a of a first connecting part 31 which will be described later) is fixed to the surface 21a of the main body 21 via the bonding layer 22. The other end of the connecting terminal 30 (that is, a second connecting part 32 which will be described later) projects from the other surface 21b of the main body 21. The connecting terminal 30 is inserted into the penetrating hole 21x in a state in which the connecting terminal 30 may function as a spring. In other words, the part of the connecting terminal 30 inserted into the penetrating hole 21x is not fixed to the inner wall surface defining the penetrating hole 21x, and may undergo resilient deformation. For this reason, essentially the entire connecting terminal 30, including the part of the connecting terminal 30 inserted into the penetrating hole 21x, and excluding first connecting part 31 which will be described later, may function as a spring.

The end of the connecting terminal 30, on the side of the other surface 31b of the first connecting part 31 which will be described later, is electrically connected to a conductor layer (or pad) 72 by being bonded to the conductor layer 72 of the circuit board 70 via the bump 50. In other words, in the connecting terminal 30, the other surface 31b of the first connecting part 31 forms a connecting part for external connection such as a connection to the circuit board 70. The other end of the connecting terminal 30, formed by the second connecting part 32, may electrically connect to the noble metal layer 65 of the semiconductor package 60 by making contact with the noble metal layer 65 in a separable manner (that is, in a state that is not fixed). A more detailed description of the structure of the connecting terminal 30 will be given later in the specification.

The connecting terminals 30 arranged in a region A illustrated in FIG. 4 and the connecting terminals 30 arranged in a region B illustrated in FIG. 4 are arranged symmetrically to oppose each other. By this symmetrical arrangement of the connecting terminals 30, a reaction generated in a horizontal direction (that is, a direction other than a Z-axis direction) may be reduced when the connecting terminal 30 is pushed in the Z-axis direction. The effect of reducing the reaction is particularly notable when the number of connecting terminals 30 is relatively large. On the other hand, when the number of connecting terminals 30 is relatively small and the reaction generated in the horizontal direction (that is, the direction other than the Z-axis direction) is negligible, the connecting terminal 30 arranged in the region A and the connecting terminal 30 arranged in the region B may be oriented to face the same direction.

The positioning part 40 has a planar shape that is frame-shaped, and may be formed by a material having an epoxy resin or the like as a main component, for example. A bottom surface of the positioning part 40 is fixed to an outer peripheral part of the other surface 21b of the main body 21 forming the support member 20, using a bonding agent or the like. The positioning part 40 may be mechanically fixed to the support member 20 using screws or the like. Inner surfaces of the positioning part 40 form a space having a planar shape that matches or approximately matches a planar shape of a substrate 61 of the semiconductor package 60 which will be described later. Hence, the semiconductor package 60 may be inserted into the space formed by the inner surfaces of the positioning part 40.

The inner surfaces of the positioning part 40 makes contact with side surfaces of the substrate 61 of the semiconductor package 60 that is inserted into the space, in order to position the semiconductor package 60 and the socket 10. Hence, each noble metal layer 65 of the semiconductor package 60 makes contact with the second connecting part 32 of the corresponding connecting terminal 30 of the socket 10. In addition to the function of positioning the semiconductor package 60 and the socket 10, the positioning part 40 also has a function to reinforce the strength of the support member 20.

The positioning part 40 may not be an essential constituent element of the socket 10. For example, instead of providing the positioning part 40, the semiconductor package 60 may be positioned by a frame part 81 of the housing 80 which will be described later.

The bump 50 is formed on one end of the connecting terminal 30 (on the side of the other surface 31b of the first connecting part 31). The bump 50 electrically connects the end of the connecting terminal 30 (first connecting part 31) to the conductor layer 72 of the circuit board 70. The bump 50 may be formed by solder, for example. The solder material may be an alloy including Pb, or a Pb-free solder such as an alloy of Sn and Cu, an alloy of Sn and Ag, and an alloy of Sn, Ag and Cu. Instead of using the solder, the bump 50 may be formed by a conductive resin bonding agent (or adhesive agent), such as Ag paste. The bump 50 may not be an essential constituent element of the socket 10. For example, instead of providing the bump 50 in the socket 10, a bump formed by solder, conductive resin bonding agent, or the like may be provided on the conductor layer 72 of the circuit board 70.

The semiconductor package 60 includes the substrate 61, a semiconductor chip 62, an encapsulating resin 63, a conductor layer 64, and the noble metal layer 65. The substrate 61 may include a substrate base made of an insulative resin, and an insulator layer, a wiring pattern, a via wiring, and the like (not illustrated) that are formed on the substrate base. The semiconductor chip 62 made of Si and the like is formed on one surface of the substrate 61, and the conductor layer 64 forming a part of the wiring pattern made of Cu, for example, is formed on the other surface of the substrate 61.

The conductor layer 64 may be formed by Cu, for example, to a thickness in a range of 5 µm to 10 µm, for example. The semiconductor chip 62 may be mounted on the substrate 61 by flip-chip bonding, for example, and encapsulated by the encapsulating resin 63 made of an insulative resin. The encapsulating resin 63 may be formed to expose a back surface of the semiconductor chip 62, in order to arrange on the back surface of the semiconductor chip 62 a radiator plate (or fins) made of Cu or the like, for example.

The noble metal layer 65 is stacked on top of the conductor layer 64. The conductor layer 64 and the noble metal layer 65 are formed on the other surface of the substrate 61 in order to provide pads arranged in an array. In other words, the semiconductor package 60 forms the so-called LGA (Land Grid Array), and the socket 10 forms the so-called LGA socket.

For example, the noble metal layer 65 may be formed by a layer that includes a noble metal, such as Au and Pd. The noble metal layer 65 may be formed by electroless plating, for example. An underlayer may be provided underneath the Au layer forming the noble metal layer 65, and the underlayer may be formed by a Ni layer or a metal multi-layer such as a Ni/Pd layer having a Ni layer and a Pd layer that are successively stacked in this order.

The noble metal layer 65 is provided in order to improve the reliability of the connection between the connecting terminal 30 and the conductor layer 64. The noble metal layer 65 may be formed to a thickness that is considerably thick compared to a metal layer that is formed by a general plating technique, in order to stabilize the contact resistance with respect to the connecting terminal 30. Generally, a metal layer that is formed by the general plating technique in order to improve the reliability of the connection with the solder ball or the like is on the order of 0.05 µm or less. On the other hand, the thickness of the noble metal layer 65 is on the order of 0.4 µm which is approximately 8 or more times the thickness of the metal layer that is formed by the general plating technique.

The circuit board 70 includes a main substrate body 71, and the conductor layer (or pad) 72. The conductor layer 72 is formed on one surface of the main substrate body 71. For example, the main substrate body 71 may be formed by a glass cloth impregnated with an insulative resin such as an epoxy resin. The conductor layer 72 may be made of Cu, for example.

The housing 80 includes a lid part 82. The frame part 81 has a planar shape that is frame-shaped, and is provided on an outer side of an outer surface of the positioning part 40. The frame part 81 may be made of a metal, a resin or the like having rigidity. The frame part 81 is fixed on the top surface of the circuit board 70 using bolts (not illustrated) or the like penetrating the circuit board 70.

The lid part 82 may be made of a metal, a resin, or the like, for example. A planar shape of the lid part 82 may be approximately rectangular or, approximately frame-shaped. The lid part 82 may be mounted in a pivotable manner about one end on the top surface of the frame part 81 (that is, may be configured to open and close), for example, and include a lock mechanism on the other end of the top surface of the frame part 81. By fixing (or locking) the lid part 82 so that the outer peripheral part of the lid part 82 makes contact with the top surface of the frame part 81 as illustrated in FIGS. 4 and 5, the lid part 82 pushes the semiconductor package 60 towards the circuit board 70, to thereby move the semiconductor package 60 towards the circuit board 70.

Accordingly, the connecting terminal 30 of the socket 10 is pushed and compressed in the Z-axis direction, to generate a predetermined spring force. In addition, the noble metal layer 65 of the semiconductor package 60 makes contact with the other end of the connecting terminal 30 (second connecting part 32). In other words, the semiconductor package 60 is electrically connected to the circuit board 70 via the socket 10. By unlocking the locking mechanism of the lid part 82, the semiconductor package 60 becomes removable from the socket 10. In other words, the semiconductor package 60 is detachably connected to the socket 10, such that the semiconductor package 60 is attachable to and is detachable from the socket 10.

The lid part 82 and the frame part 81 may be formed by separate parts. In this case, the lid part 82 may be fixed to the frame part 81 in a state in which the semiconductor package 60 is pushed from the upper end by the lid part 82.

Figure 1:
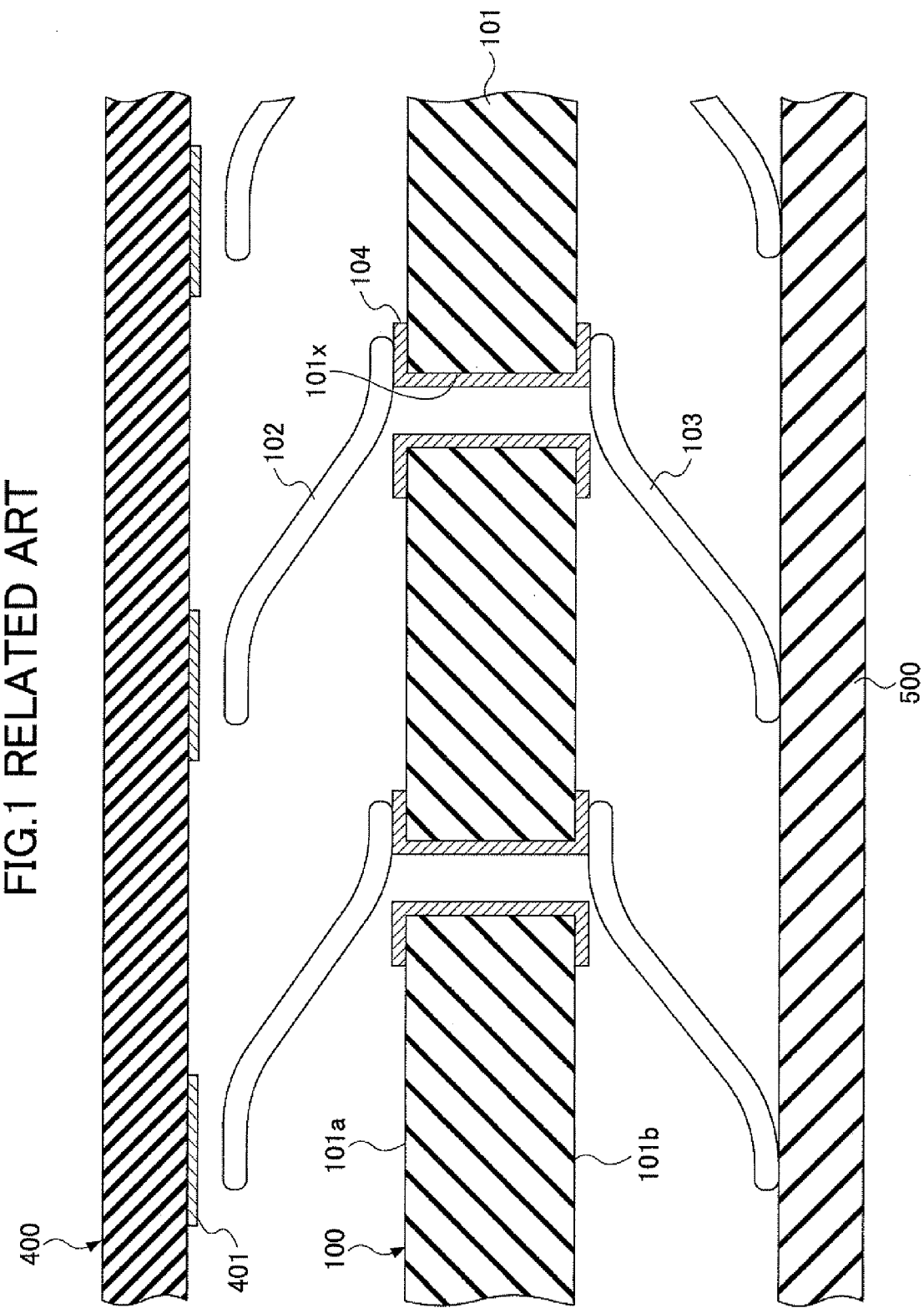
FIG. 1 is a cross sectional view illustrating a first example of a conventional socket.

Unlike the conventional socket 100 illustrated in FIG. 1 in which the connecting terminals 102 and 103 project from both surfaces of the support member 101, the connecting terminals 30 of the socket 10 project from one surface of the support member 20. For this reason, the distance from one end to the other end of the connecting terminal 30 may be reduced compared to that of the conventional socket 100. As a result, the height of the socket 10 may be made lower, and the connecting distance (signal transmission path) between the semiconductor package 60 and the circuit board 70 may be reduced, when compared to the conventional socket 100.

Figure 2:
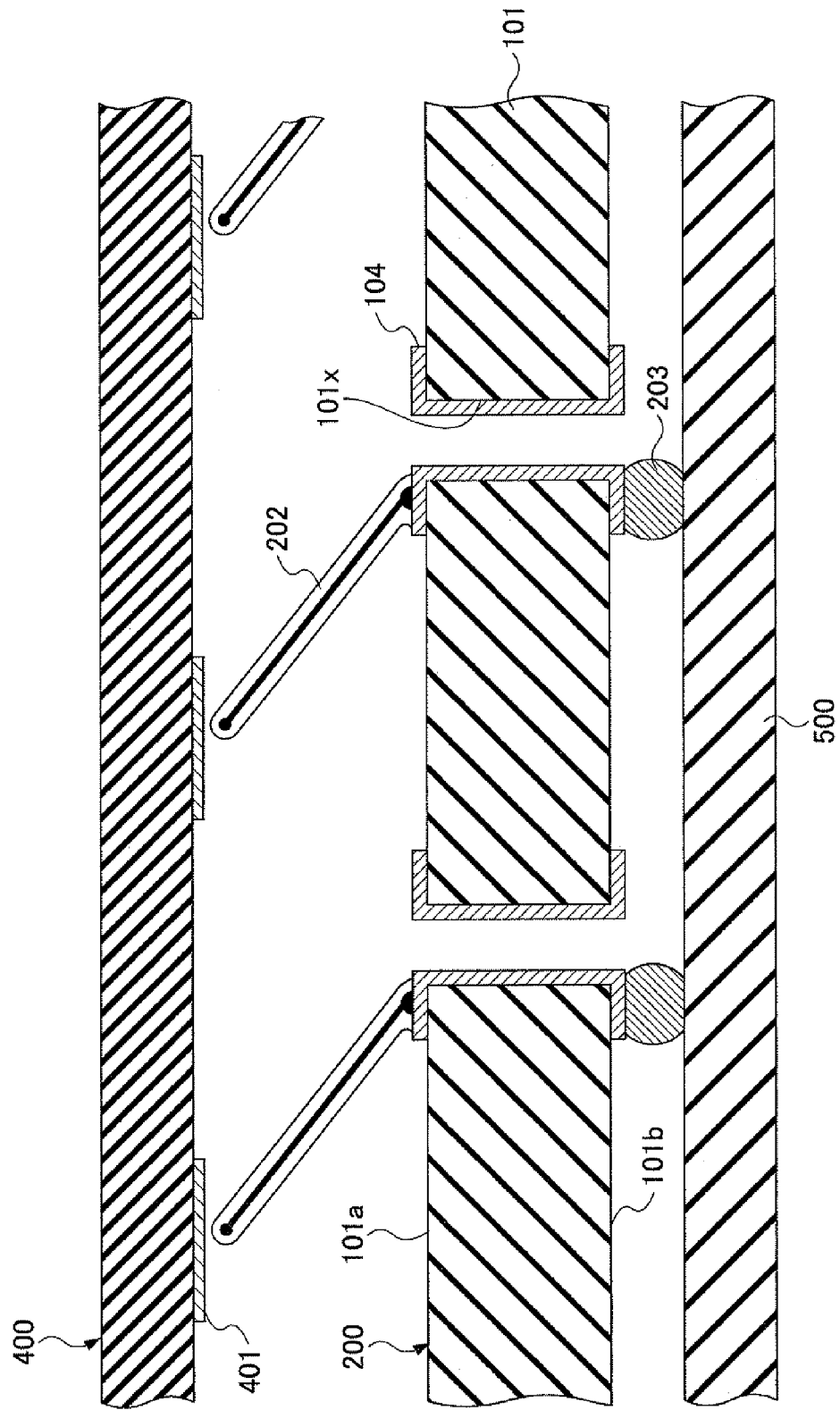
FIG. 2 is a cross sectional view illustrating a second example of the conventional socket.

Unlike the conventional socket 200 illustrated in FIG. 2 in which the signal from the connecting item to the circuit board passes through the connecting terminal 202 and the wiring 104 within the through hole 101x, the signal from the semiconductor package 60 directly reaches the circuit board 70 via the bump 50 provided on one end of the connecting terminal 30 that is inserted into the penetrating hole 21x having no wiring provided therein when the socket 10 is used. As a result, the thickness of the support member 20 does not become a cause that prevents the height reduction of the socket 10. Hence, the height of the socket 10 may be reduced and the connecting distance (signal transmission path) between the semiconductor package 60 and the circuit board 70 may be reduced, when compared to the conventional socket 200.

Figure 3:
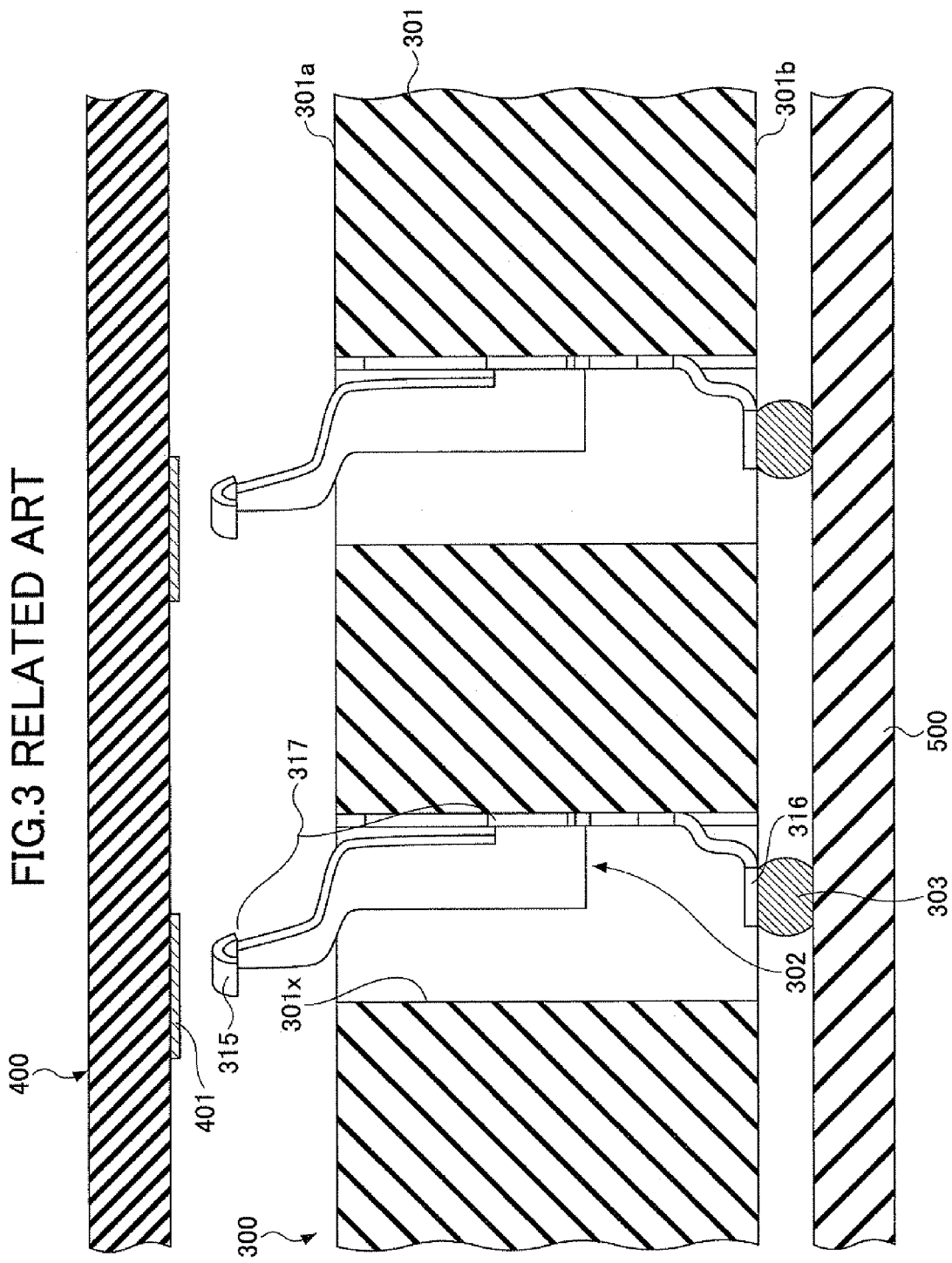
FIG. 3 is a cross sectional view illustrating a third example of the conventional socket.

Furthermore, unlike the conventional socket 300 illustrated in FIG. 3 in which a part of the connecting terminal 302 is fixed or fit within the penetrating hole 301x, the connecting terminal 30 of the socket 10 is inserted into the penetrating hole 21x in a state in which the connecting terminal 30 may function as a spring. In other words, the part of the connecting terminal 30 inserted into the penetrating hole 21x is not fixed to the inner wall surface defining the penetrating hole 21x and is resiliently deformable. For this reason, approximately the entire connecting terminal 30, including the part of the connecting terminal 30 inserted into the penetrating hole 21x (excluding the first connecting part 31), may function as a spring. As a result, the connecting terminal 30 itself may have a height lower than that of the connecting terminal 302 of the conventional socket 300.

Therefore, the height of the socket 10 may be made lower, and the connecting distance (signal transmission path) between the semiconductor package 60 and the circuit board 70 may be reduced, when compared to the conventional socket 300. By reducing the connecting distance (signal transmission path), the parasitic inductance, the parasitic capacitance, the parasitic resistance and the like may be reduced, to enable high-speed signal transmission. In addition, because no wiring is provided within the penetrating hole 21x of the support member 20, there is no need to provide an additional insulator layer, which in turn also contributes to the reduction of the parasitic capacitance and improves the adaptability to high-speed signal transmission.

Moreover, in the socket 10, the connecting terminal 30 having the spring property is directly fixed to the support member 20. In other words, unlike the conventional socket 300 illustrated in FIG. 3, a housing that may cause warping does not exist in the socket 10, and the socket 10 is unlikely to generate warping. By suppressing the possibility of warping, the socket 10 may improve the reliability of the connection between the semiconductor package 60 and the circuit board 70.

Figure 6:
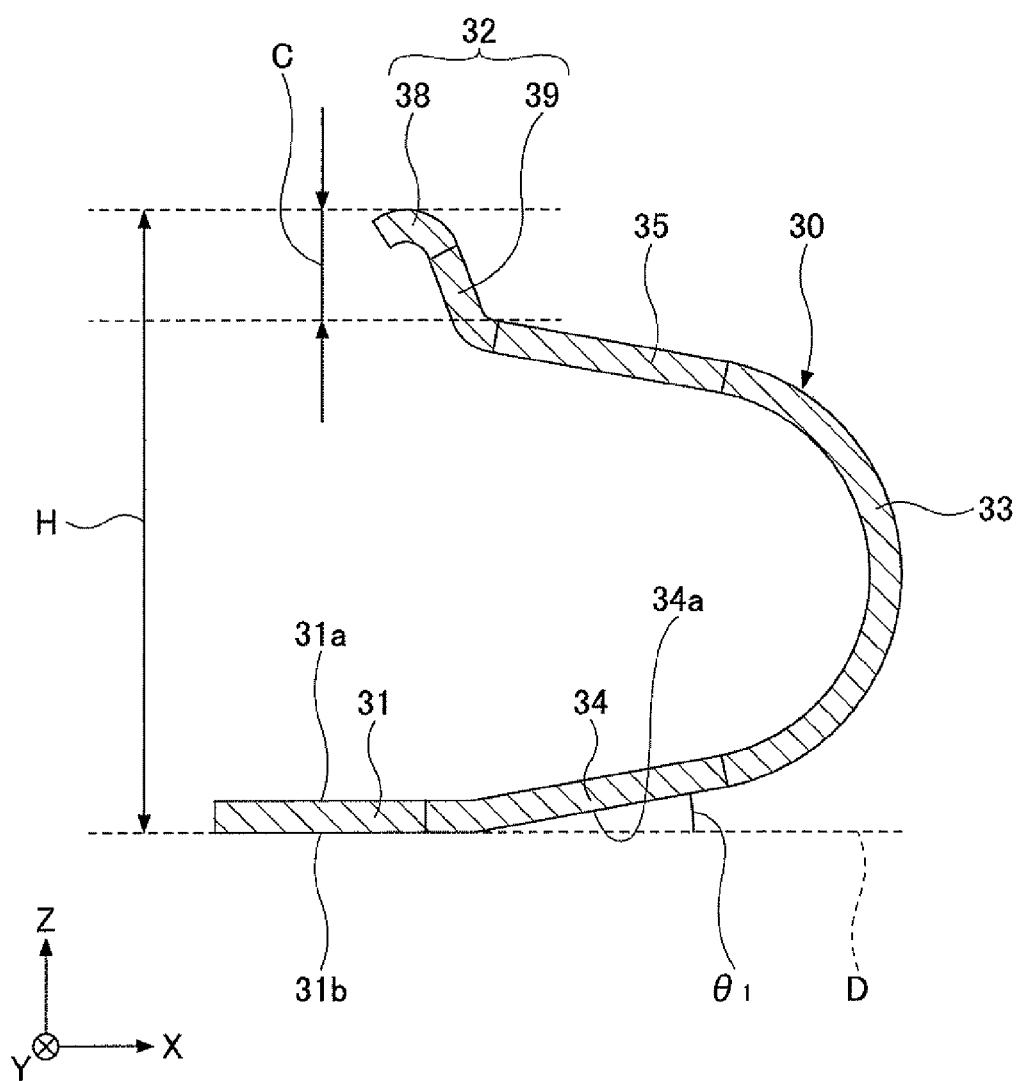
FIG. 6 is a cross sectional view illustrating an example of a connecting terminal in the first embodiment.

Next, a more detailed description will be given of the structure of the connecting terminal 30, by referring to FIG. 6. FIG. 6 is a cross sectional view illustrating an example of the connecting terminal in the first embodiment. The connecting terminal 30 illustrated in FIG. 6 includes the first connecting part 31, the second connecting part 32, a spring part 33, a first support part 34, and a second support part 35. As described above, the connecting terminal 30 is conductive and has a spring property.

The first connecting part 31 is formed on one end of the connecting terminal. The first connecting part 31 has a plate shape. The thickness of the first connecting part 31 taken along the Z-axis direction may be on the order of 0.08 mm, for example. A horizontal width of the first connecting part 31 taken along a Y-axis direction may be on the order of 0.4 mm, for example. A vertical length of the first connecting part 31 taken along a X-axis direction may be on the order of 0.4 mm, for example.

One surface 31a of the first connecting part 31 is fixed to the surface 21a of the main body 21 via the bonding layer 22, for example. The other surface 31b of the first connecting part 31 is electrically connected to the circuit board 70 via the bump 50 provided on the surface 31b, for example. Alternatively, the surface 31b of the first connecting part 31 may be electrically connected to the circuit board 70 in a state in which the surface 31b makes contact with but is separable from (not fixed to) the bump provided on the circuit board 70, for example.

The second connecting part 32 is provided on the other end of the connecting terminal 30, and is arranged to oppose the first connecting part 31. The second connecting part 32 is electrically connected to the first connecting part 31 via the spring part 33, the first support part 34, and the second support part 35. The second connecting part 32 includes a contact part 38 and a projecting part 39. The thickness of the second connecting part 32 may be on the order of 0.08 mm, for example. The horizontal width of the second connecting part 32 taken along the Y-axis direction may be on the order of 0.2 mm, for example.

The contact part 38 is configured to make contact with the pad of the connecting item, that is, the noble metal layer 65 of the semiconductor package 60, for example. The contact part 38 has a round or rounded shape, and mainly moves in the Z-axis direction when the connecting terminal 30 is pushed in the Z-axis direction. Due to the round or rounded shape of the contact part 38, the noble metal layer (or pad) 65 may be prevented from being damaged upon contact with the contact part 38 when the connecting terminal 30 is pushed in the Z-axis direction.

In addition, when the semiconductor package 60 pushes the second connecting part 32, the contact part 38 makes contact with the noble metal layer 65 in a state in which the second connecting part 32 has moved in the Z-axis direction to approach the first connecting part 31 due to the deformation of the spring part 33. Hence, when the noble metal layer 65 and the second connecting part 32 make contact, the second connecting part 32 will not move a large distance in a direction parallel to the surface formed with the noble metal layer 65, and consequently, the noble metal layer 65 may be arranged at a relatively narrow pitch. For example, the noble metal layer 65 (or the contact part 38) may be arranged at a pitch in a range of 0.4 mm to 1.5 mm One end of the projecting part 39 is integrally formed on the second support part 35, and the other end of the projecting part 39 is integrally formed on the contact part 38. The projecting part 39 projects from the second support part 35 in a direction towards the noble metal layer 65 (that is, in a direction separating from the first connecting part 31).

Hence, the projecting part 39 is provided between the contact part 38 and the second support part 35, integrally to the contact part 38 and the second support part 35, and projects from the second support part 35 in the direction towards the noble metal layer 65 (that is, in the direction separating from the first connecting part 31). For this reason, the contact between the noble metal layer 65 and the second support part 35 due to the deformation of the spring part 33 may be prevented when the semiconductor package 60 pushes the contact part 38, in order to prevent damage to the connecting terminal 30 and the noble metal layer 65.

A projecting amount C of the second connecting part 32 in a state in which the noble metal layer 65 and the second connecting part 32 are not in contact (that is, a projecting amount with reference to a connecting part where the second support part 35 and the projecting part 39 connect) may be set to 0.3 mm, for example.

The spring part 33 is provided between the first support part 34 and the second support part 35, and is integrally formed on the first support part 34 and the second support part 35. The spring part 35 has a curved shape, such as an approximate C-shape, and has a spring property.

The spring part 33 generates a repulsive force in a direction that causes the second connecting part 32 to move towards the noble metal layer 65 when the second connecting part 32 is pushed by the semiconductor package 60, in order to make the second connecting part 32 and the noble metal layer 65 contact each other without fixing the two together. The horizontal width of the spring part 33 in the Y-axis direction and the thickness of the spring part 33 may be the same as the horizontal width of the second connecting part 32 in the Y-axis direction and the thickness of the second connecting part 32, for example.

In the connecting terminal 30 of this embodiment, the first support part 34, the spring part 33, the second support part 35, and the second connecting part 32 integrally function as a spring. The spring constant of the connecting terminal 30 at parts corresponding to the first support part 34, the spring part 33, the second support part 35, and the second connecting part 32 may be set to 0.6 N/mm to 0.8 N/mm, for example.

The first support part 34 is provided between the spring part 33 and the first connecting part 31. One end of the first support part 34 is integrally formed on one end of the spring part 33. The other end of the first support part 34 is integrally formed on the first connecting part 31. The first support part 34 has a plate shape.

The first support part 34 forms an acute angle $\theta_1$ between a plane D that includes the surface 31b of the first connecting part 31 on the side opposing the circuit board 70 and a surface 34a of the first support part 34 on the side opposing the circuit board 70. For example, the angle $\theta_1$ may be in a range of 5 degrees to 15 degrees.

By making the angle $\theta_1$ acute, the contact between the circuit board 70 and the first support part 34 may be prevented when the semiconductor package 60 pushes the contact part 38 and deforms the spring part 33. As a result, the damage to the connecting terminal 30 and the circuit board 70 may be prevented. The horizontal width of the first support part 34 in the Y-axis direction and the thickness of the first support part 34 may be the same as the horizontal width of the second connecting part 32 in the Y-axis direction and the thickness of the second connecting part 32, for example.

The second support part 35 is provided between the spring part 33 and the second connecting part 32. One end of the second support part 35 is integrally formed on one end of the spring part 33. The other end of the second support part 35 is integrally formed on the projecting part 39 of the second connecting part 32. The second support part 35 has a plate shape. The horizontal width of the second support part 35 in the Y-axis direction and the thickness of the second support part 35 may be the same as the horizontal width of the second connecting part 32 in the Y-axis direction and the thickness of the second connecting part 32, for example.

In the state illustrated in FIG. 6, in which the second connecting part 32 of the connecting terminal 30 is not pushed, a height H of the connecting terminal 30 in the Z-axis direction may be on the order of 1 mm to 2 mm, and may preferably be on the order of 1.6 mm.

[Socket Fabricating Method in First Embodiment]

Next, a description will be given of a method of fabricating the socket 10, by referring to FIGS. 7 through 14. FIGS. 7 through 14 are diagrams for explaining the method of fabricating the socket in the first embodiment. For the sake of convenience, the support member 20 and the like in FIG. 7 and FIGS. 9 through 11 are illustrated in an inverted (or upside down) state as compared to FIGS. 4 and 5.

Figure 7:
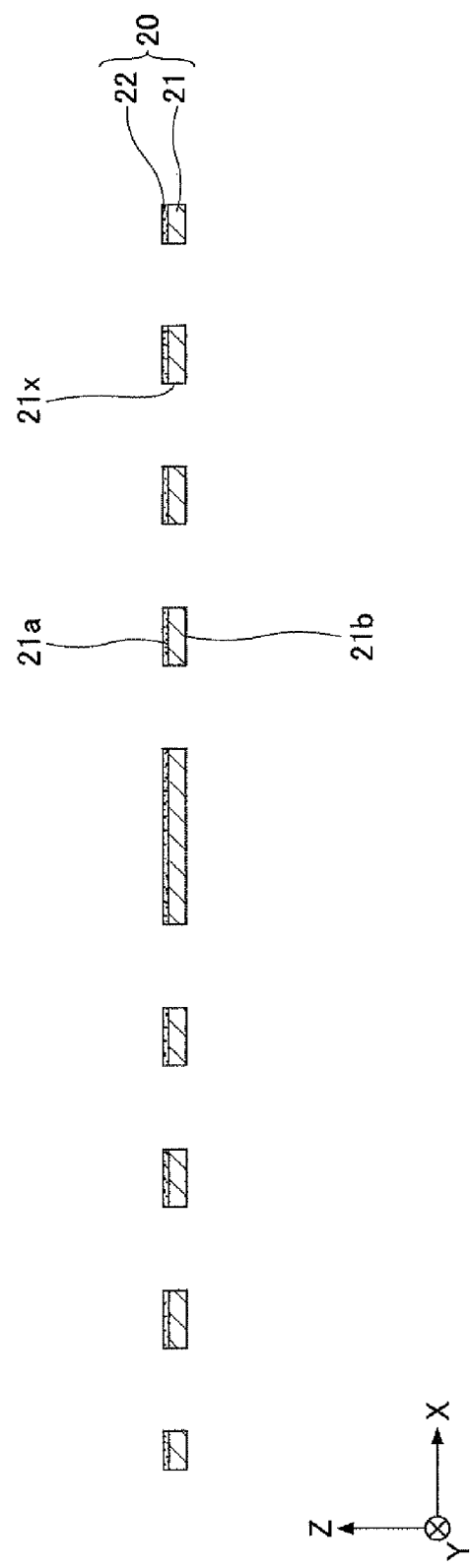
FIG. 7 is a diagram for explaining a method of fabricating the socket in the first embodiment.
Figure 8:
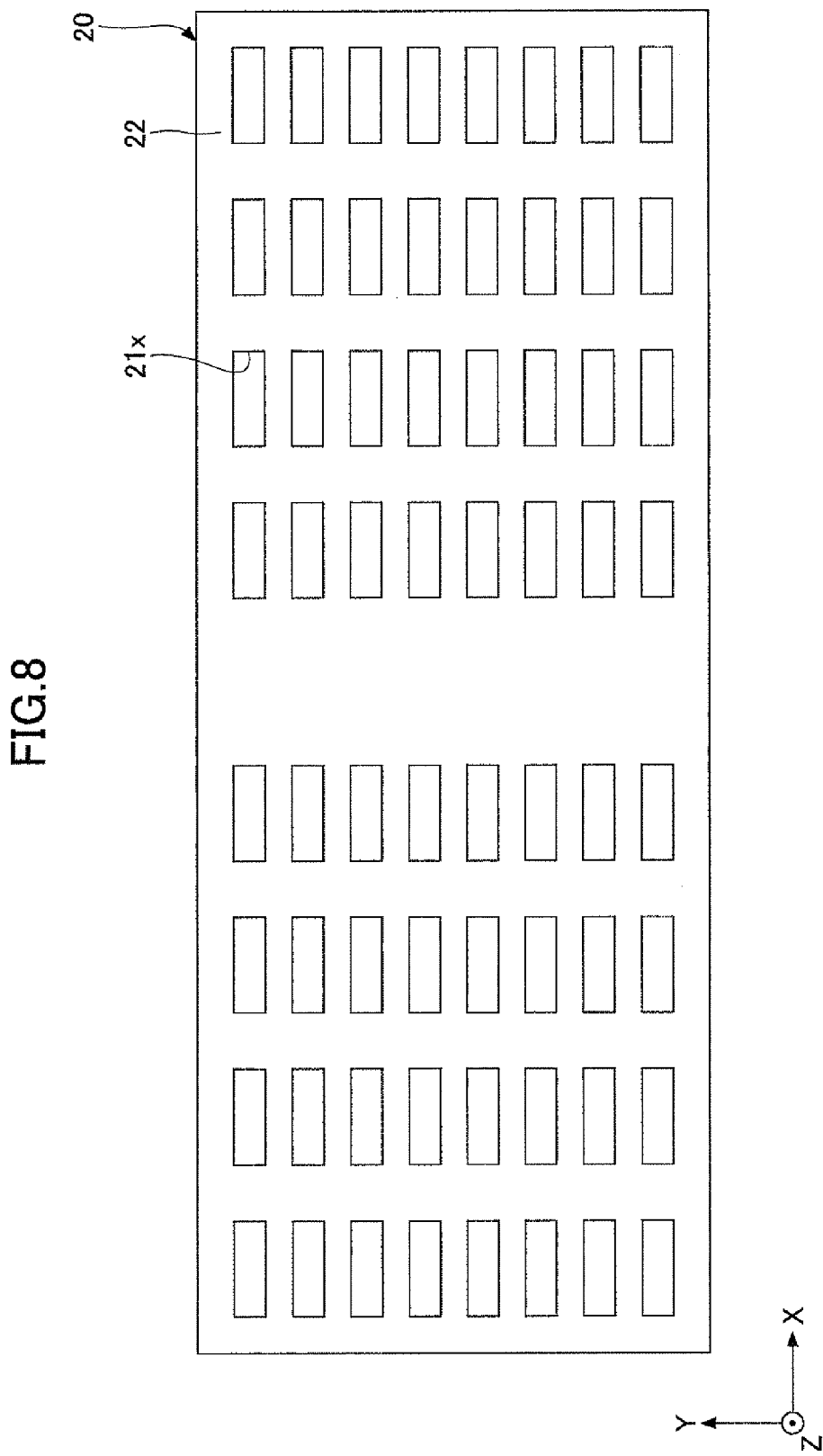
FIG. 8 is a diagram for explaining the method of fabricating the socket in the first embodiment.

First, in a process illustrated in a cross sectional view of FIG. 7 and a plan view of FIG. 8, the support member 20 provided with the bonding layer 22 on the surface 21a of the main body 21 is prepared, and the penetrating holes 21x are formed in the main body 21. The penetrating holes 21x may be formed by pressing (punching) and diecutting of the main body 21 together with the bonding layer 22 The number of penetrating holes 21x that are formed corresponds to the number of noble metal layers (or pads) 65 of the semiconductor package 60. For example, the penetrating holes 21x have a planar shape that is rectangular.

Figure 11:
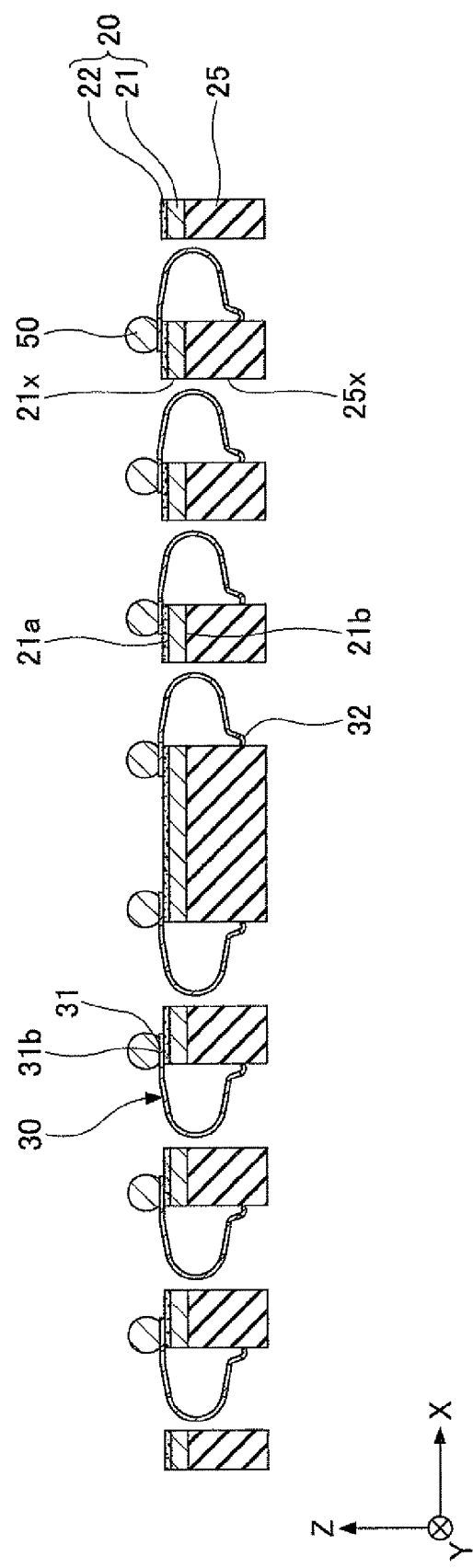
FIG. 11 is a diagram for explaining the method of fabricating the socket in the first embodiment.

For example, a polyimide film may be used for the main body of the support member 20, and a silicone thermosetting bonding agent may be used for the bonding layer 22. Of course, other materials described in conjunction with the structure of the socket 10 in this embodiment may be used for the main body 21 and the bonding layer 22. The bonding layer 22 may preferably be made of a material that does not melt, even when a heating process described later in conjunction with FIG. 11 is carried out by a solder reflow or the like during the fabrication process of the socket 10, or the bonding layer 22 reaches a high temperature due to heat generated from the semiconductor package 60 or the environmental (or ambient) temperature in which the socket 10 is used. In FIG. 7, the bonding layer 22 is provided on the entire surface 21a of the main body 21. However, the bonding layer 22 may be provided on the surface 21a of the main body 21 only in a vicinity of a part where the connecting terminal 30 is fixed.

Figure 9:
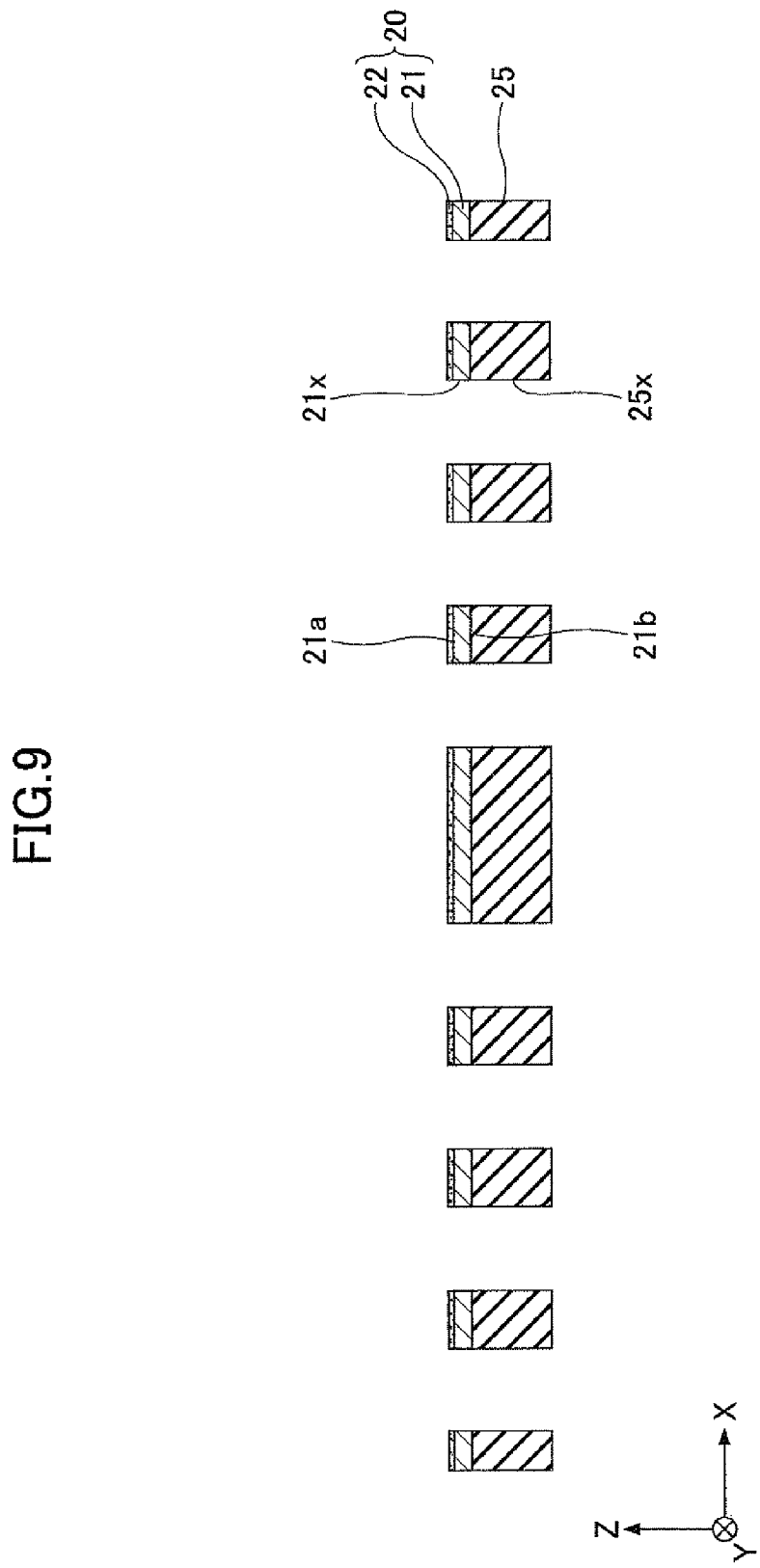
FIG. 9 is a diagram for explaining the method of fabricating the socket in the first embodiment.

Next, in a process illustrated in FIG. 9, the support member 20 is placed on a jig 25. The jig 25 has a thickness greater than the height H of the connecting terminal 30 illustrated in FIG. 6, and includes penetrating holes (or openings) 25x, configured to accommodate the connecting terminals 30, at positions corresponding to the penetrating holes 21x of the support member 20. The support member 20 is placed on the jig 25 so that the surface 21b of the main body 21 makes contact with a top surface of the jig 25, and the penetrating holes 21x and the penetrating holes 25x overlap (or match) in the plan view. Recesses having a depth greater than or equal to the height H of the connecting terminal 30 may be provided in the jig 25 in place of the penetrating holes 25x.

Figure 10:
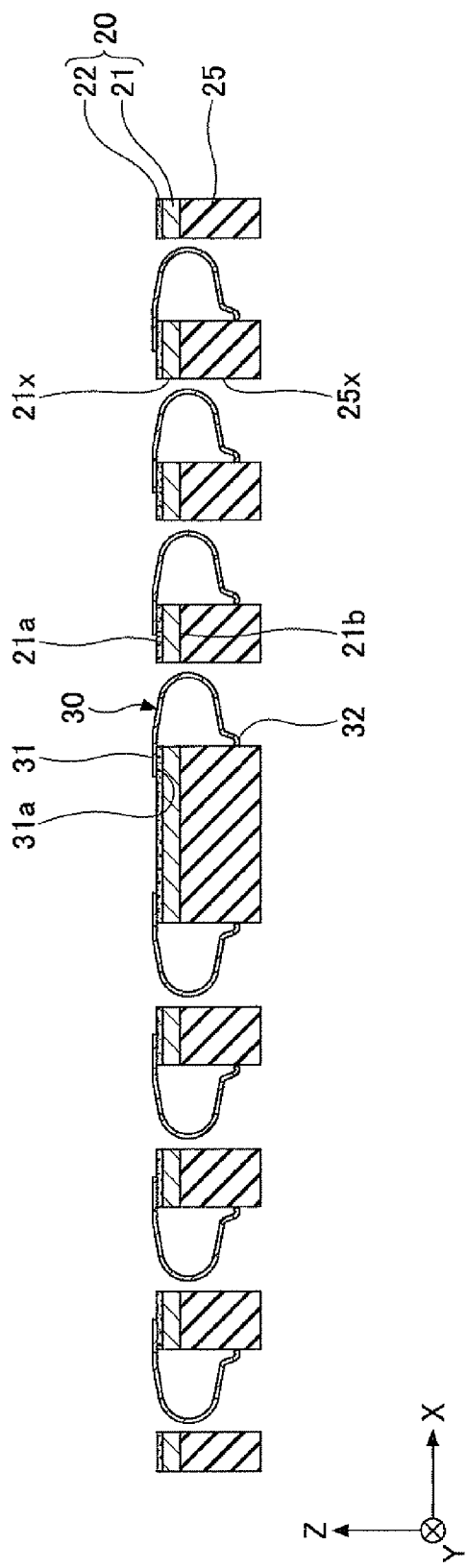
FIG. 10 is a diagram for explaining the method of fabricating the socket in the first embodiment.

Next, the connecting terminals 30 are formed in a process illustrated in FIG. 10. The connecting terminals 30 that are formed are inserted into the penetrating holes 21x and 25x, from the side of the second connecting parts 32, and are provisionally fixed so that the surfaces 31a of the first connecting parts 31 make contact with the bonding layers 22. In addition, in a state in which each connecting terminal 30 is pressed against the bonding layer 22, the bonding layer 22 is heated to a thermosetting temperature or higher, in order to fix the first connecting part 31 to the main body 21 of the support member 20 via the bonding layer 22.

The connecting terminal 30 may be formed from a metal plate (not illustrated) made of a Cu alloy, for example. The metal plate may be subjected to punching and diecutting in order to obtain a metal plate strip of a predetermined width. The surface of the metal plate strip may be plated to form a Ni plated layer having a thickness of 1 μm to 3 μm, for example. A Au plated layer having a thickness of 0.3 μm to 0.5 μm, for example, may be formed on the Ni plated layer at parts corresponding to the first connecting part 31 and the contact part 38, in order to partially form a plated multi-layer of Ni and Au. Thereafter, the metal plate strip having the Ni plated layer and the Au plated layer is bent to the shape illustrated in FIG. 6.

The Cu alloy forming the metal plate used for the connecting terminals 30 may be phosphor bronze, beryllium copper, Corson alloy of copper, and the like, for example. The connecting terminals 30 may also be formed by etching the metal plate made of Cu alloy or the like into predetermined shapes, and bending the predetermined shaped metal plate pieces to the shape illustrated in FIG. 6.

Next, in a process illustrated in FIG. 11, solder is placed on the surface 31b of the first connecting part 31, by coating solder paste or placing solder balls, for example, and a reflow process is carried out in order to form the bumps 50. The solder material may be an alloy including Pb, or a Pb-free solder such as an alloy of Sn and Cu, an alloy of Sn and Ag, and an alloy of Sn, Ag and Cu. Instead of using the solder, the bumps 50 may be formed by a conductive resin bonding agent (or adhesive agent), such as Ag paste.

As described above, the Ni plated layer is formed on the surface of the connecting terminal 30, and the Au plated layer is further formed on the Ni plated layer on the first connecting part 31. For this reason, the solder may easily be formed only on the first connecting part 31, and the wetting of the parts having no Au plated layer formed thereon (parts where the Ni plated layer is exposed) by the solder may be suppressed or prevented.

Instead of providing the bumps 50 on the socket 10, bumps made of solder or a conductive resin bonding agent or the like may be provided on the conductor layer 72 of the circuit board 70. In this case, the process described above in conjunction with FIG. 11 may be omitted.

Figure 12:
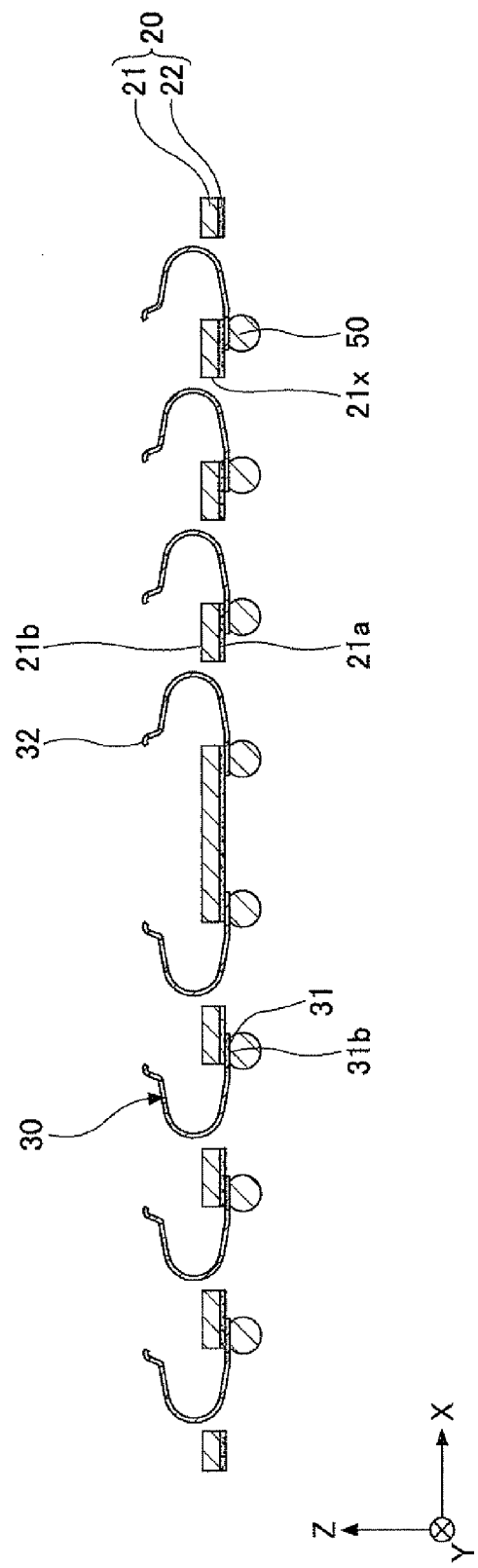
FIG. 12 is a diagram for explaining the method of fabricating the socket in the first embodiment.
Figure 13:
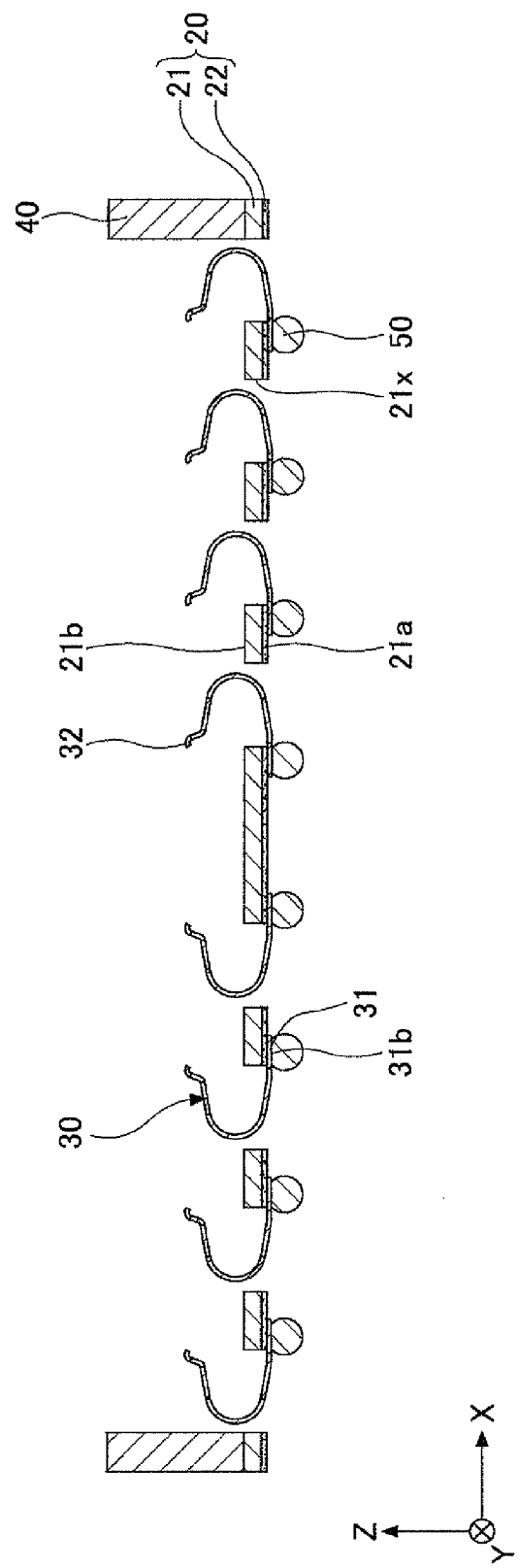
FIG. 13 is a diagram for explaining the method of fabricating the socket in the first embodiment.

Next, in a process illustrated in FIG. 12, the jig 25 is removed from the support member 20, and the support member 20 is turned over (that is, upside down). Then, in a process illustrated by a cross section in FIG. 13 and a plan view in FIG. 14, the positioning part 40 is fixed to the outer peripheral part of the surface 21b of the main body 21 forming the support member 20, using a bonding agent or the like. Alternatively, the positioning part 40 may be mechanically fixed on the support member 20 using screws or the like. The positioning part 40 has a planar shape that is frame-shaped, and may be formed by a material having an epoxy resin or the like as a main component, for example. In a case in which the semiconductor package 60 is positioned and held by the housing 80, the positioning part 40 may be omitted. In this case, the process described above in conjunction with FIGS. 13 and 14 may be omitted.

Therefore, the socket 10 is completed by carrying out the processes described above in conjunction with FIGS. 7 through 14.

[Method of Using Socket of First Embodiment]

Figure 15:
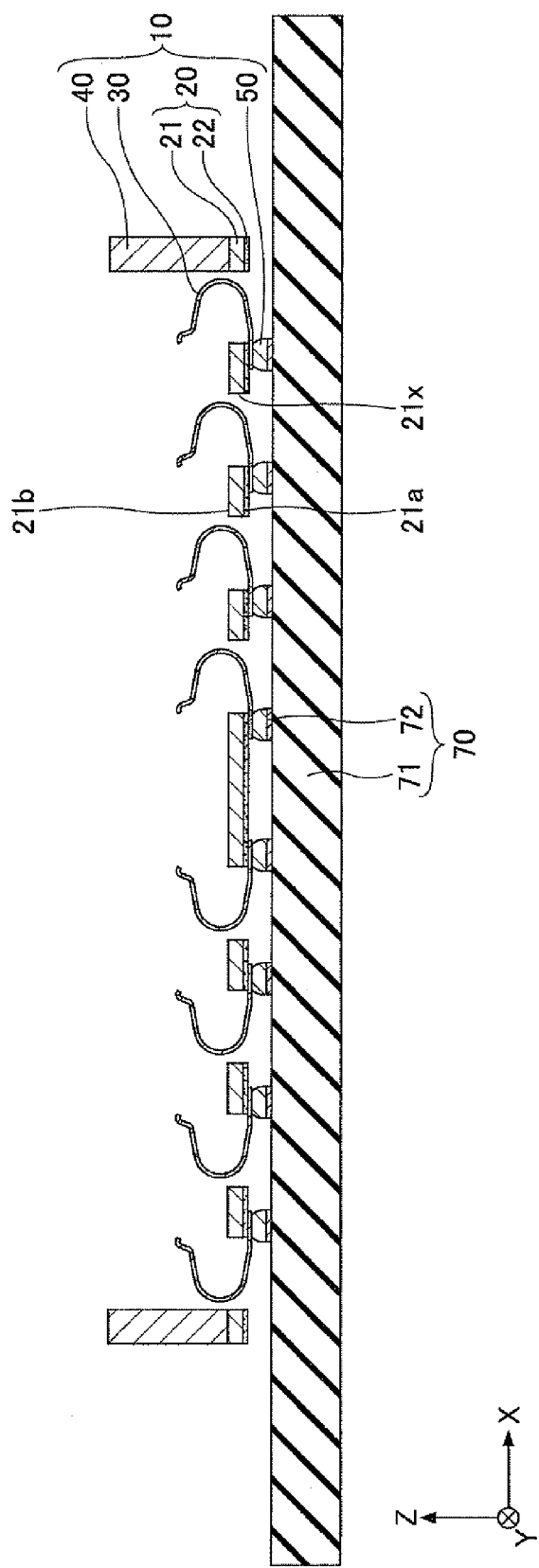
FIG. 15 is a diagram for explaining a connecting method using the socket in the first embodiment.
Figure 16:
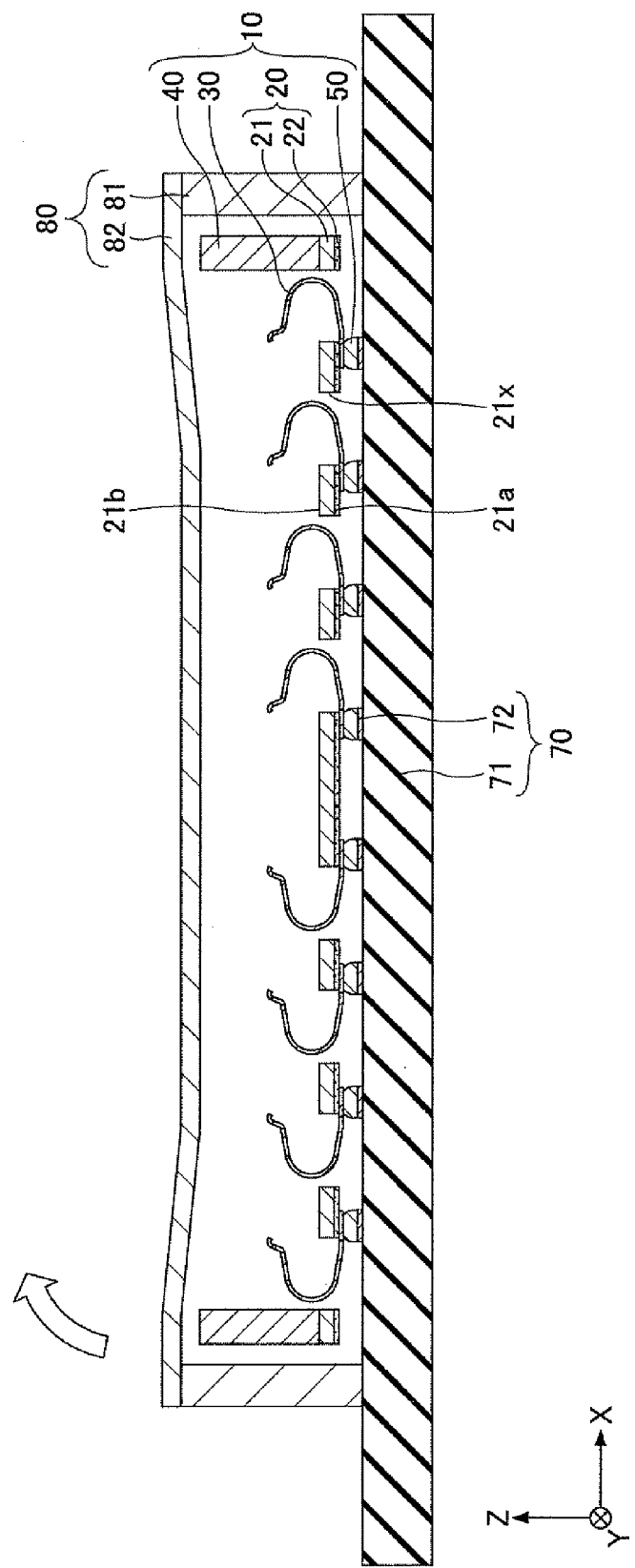
FIG. 16 is a diagram for explaining the connecting method using the socket in the first embodiment.
Figure 17:
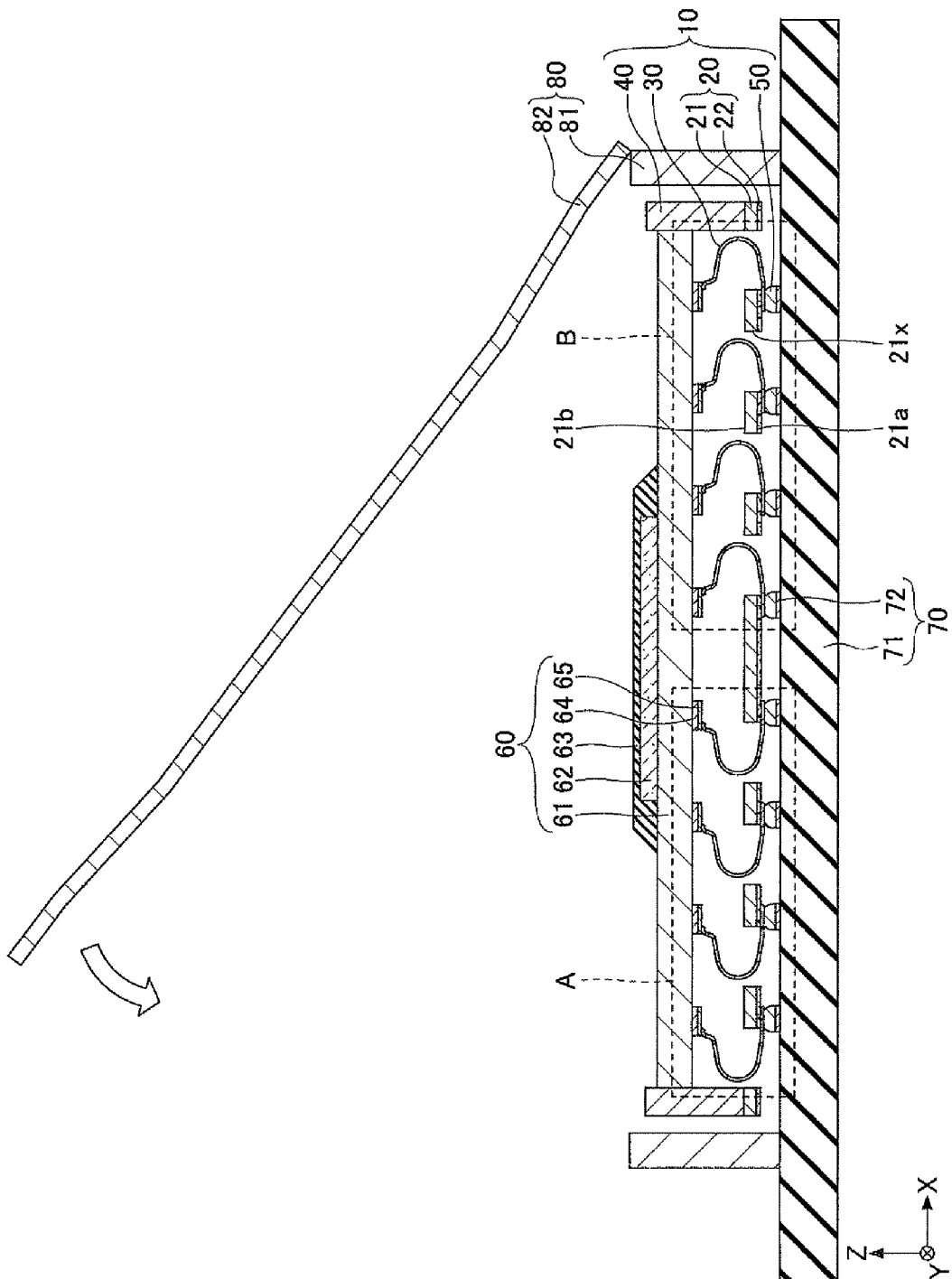
FIG. 17 is a diagram for explaining the connecting method using the socket in the first embodiment.

Next, a description will be given of a method of connecting the semiconductor package 60 and the circuit board 70 using the socket 10, by referring to FIGS. 15 through 17. FIGS. 15 through 17 are diagrams for explaining a connecting method using the socket in the first embodiment.

First, the circuit board 70 and the socket 10 are prepared, as illustrated in FIG. 15. The circuit board 70 and the socket 10 are electrically connected via the bumps 50. More particularly, the conductor layers 72 of the circuit board 70 are bonded to the bumps 50 of the socket 10. The bumps 50 are heated to 230° C., for example, and melted and thereafter cured, in order to bond the circuit board 70 and the socket 10 together. Hence, the socket 10 becomes electrically connected to the circuit board 70 via the bumps 50.

Next, the housing 80 is prepared as illustrated in FIG. 16. The frame part 81 of the housing 80 is fixed on the top surface of the circuit board 70 by bolts (not illustrated) or the like that penetrate the circuit board 70. The lid part 82 of the housing 80 is turned in a direction indicated by an arrow in FIG. 16 to a state that allows the semiconductor package 60 to be arranged within the housing 80.

Next, the semiconductor package 60 is prepared as illustrated in FIG. 17. The semiconductor package 60 is inserted into the positioning part 40, so that the side surfaces of the substrate 61 make contact with the inner surfaces of the positioning part 40. At this point in time, the connecting terminals 30 are not yet pushed. The semiconductor package 60 is positioned (or aligned) with respect to the socket 10 by the positioning part 40, and each noble metal layer 65 of the semiconductor package 60 makes contact with the second connecting part 32 of the corresponding connecting terminal 30.

In addition, the lid part 82 is turned in a direction indicated by an arrow in FIG. 17, in order to push the semiconductor package 60 towards the circuit board 70, and the lid part 82 is fixed (or locked) in a state in which the outer peripheral part of the lid part 82 makes contact with the top surface of the frame part 81. As a result, the connecting terminals 30 are compressed in the Z-axis direction to generate predetermined spring forces, and each noble metal layer 65 of the semiconductor package 60 is electrically connected to the second connecting part 32 of the corresponding connecting terminal 30. In other words, the semiconductor package 60 is electrically connected to the circuit board 70 via the socket 10, as described above in conjunction with FIGS. 4 and 5.

According to the socket of this embodiment, the connecting terminals have the spring property, and the support member includes the penetrating holes. The connecting terminals are inserted into the penetrating holes of the support member in a state in which the connecting terminals are not fixed to the inner wall surfaces defining the penetrating holes, that is, in a state in which the connecting terminals may function as springs. In addition, one end of the connecting terminal is fixed to one surface of the support member, and the other end of the connecting terminal projects from the other surface of the support member.

In other words, the thickness of the support member falls within the height range of the connecting terminals, and the thickness of the support member does not become a cause that prevents the height reduction of the socket. Moreover, approximately the entire connecting terminal, including the part of the connecting terminal inserted into the penetrating hole, may function as a spring. Hence, compared to the conventional connecting terminal having the part that is fixed within the penetrating hole, the height of the connecting terminal itself may be reduced. As a result, the height of the socket may be reduced when compared to the conventional socket.

Furthermore, no wiring is provided within the penetrating holes of the support member, and the semiconductor package and the circuit board are connected via the connecting terminals and the bumps formed on the ends of the connecting terminals. Hence, the connecting distance (signal transmission path) between the semiconductor package and the circuit board may be reduced, when compared to the conventional socket. By reducing the connecting distance (signal transmission path), the parasitic inductance, the parasitic capacitance, the parasitic resistance and the like may be reduced, to enable high-speed signal transmission.

In addition, because no wiring is provided within the penetrating holes of the support member, there is no need to provide an additional insulator layer, which in turn also contributes to the reduction of the parasitic capacitance and improves the adaptability to high-speed signal transmission.

Moreover, in the socket, the connecting terminal having the spring property is directly fixed to the support member. In other words, a housing that may cause warping does not exist in the socket, and the socket is unlikely to generate warping. By suppressing the possibility of warping, the socket may improve the reliability of the connection between the semiconductor package and the circuit board.

(First Modification of First Embodiment)

Figure 14:
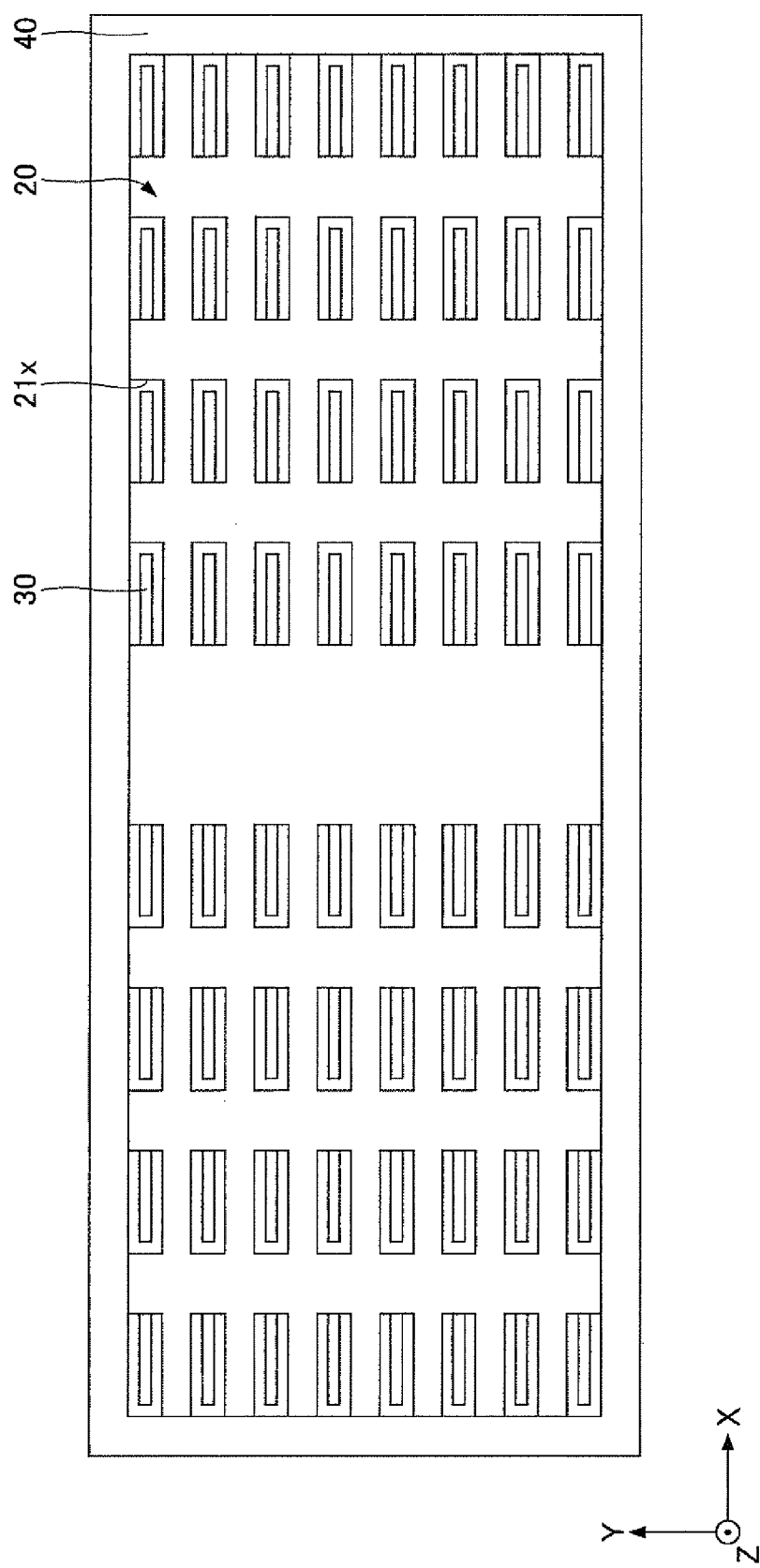
FIG. 14 is a diagram for explaining the method of fabricating the socket in the first embodiment.

In the first embodiment, the connecting terminals 30 are oriented in parallel with respect to the direction in which the connecting terminals 30 are arranged, as illustrated in FIG. 14. But in a first modification of the first embodiment, the connecting terminals 30 are oriented in a direction that is inclined (or oblique) with respect to the direction in which the connecting terminals 30 are arranged. A description of those parts of the first modification that are the same as those corresponding parts of the first embodiment will be omitted.

Figure 18:
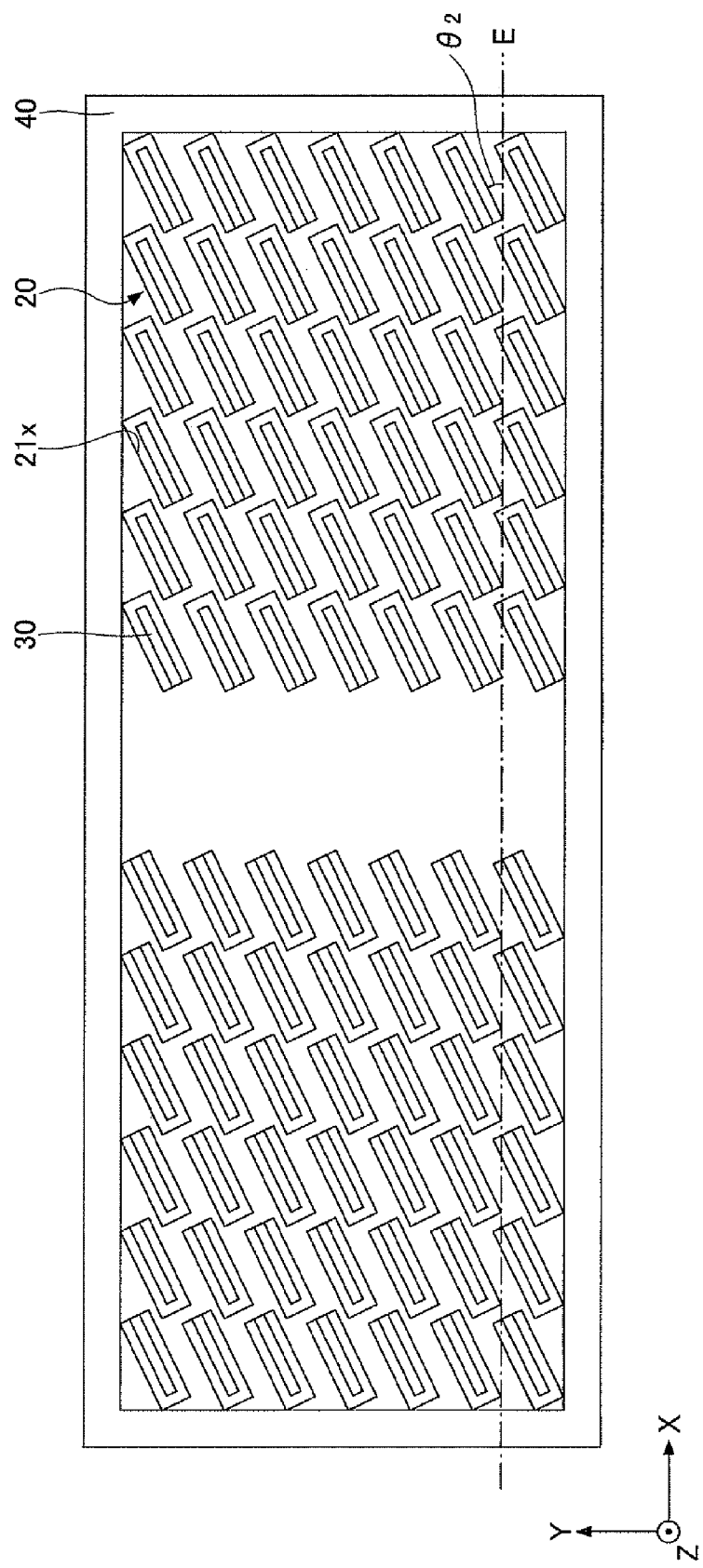
FIG. 18 is a diagram illustrating an example of an arrangement of the connecting terminals in a first modification of the first embodiment.

FIG. 18 is a diagram illustrating an example of an arrangement of the connecting terminals in this first modification of the first embodiment. As illustrated in FIG. 18, the connecting terminals 30 are oriented at a predetermined angle $\theta_2$ (>0) with respect to a direction E in which the connecting terminals 30 are arranged. In other words, the orientation of the connecting terminals 30 is inclined with respect to the direction E in which the connecting terminals 30 are arranged. For example, the predetermined angle $\theta_2$ may be in a range of 25 degrees to 35 degrees.

By the inclined orientation of the connecting terminals 30 with respect to the direction E in which the connecting terminals 30 are arranged, the number of connecting terminals 30 that may be arranged per unit area increases compared to the case in which the connecting terminals 30 are oriented in parallel with respect to the direction E in which the connecting terminals 30 are arranged. Hence, it is possible to cope with a connecting item (for example, the semiconductor package 60 or the like) that has the pads (for example, the noble metal layers 65 or the like) arranged at a narrow pitch on the order of 0.4 mm, for example.

According to this first modification of the first embodiment, it is possible to obtain effects similar to those obtainable by the first embodiment. In addition, because the orientation of the connecting terminals is inclined with respect to the direction in which the connecting terminals are arranged, this first modification may more positively cope with the LGA (Land Grid Array) having the pads arranged at a narrow pitch, as compared to the case in which the connecting terminals are oriented in parallel with respect to the direction in which the connecting terminals are arranged.

[Second Modification of First Embodiment]

In the first embodiment, one end of the connecting terminal 30 (the surface 31b of the first connecting part 31) is bonded to and electrically connected to the conductor layer 72 of the circuit board 70 via the bump 50. But in a second modification of the first embodiment, a bump 50A may make contact with and be separable from the conductor layer 72 of the circuit board 70. One end of the connecting terminal 30 (surface 31b of the first connecting part 31) makes contact with and electrically connects to the conductor layer 72 of the circuit board 70 via the bump 50A, in a state in which the bump 50A may separate from (that is, not fixed to) the bonding layer 72.

Figure 19:
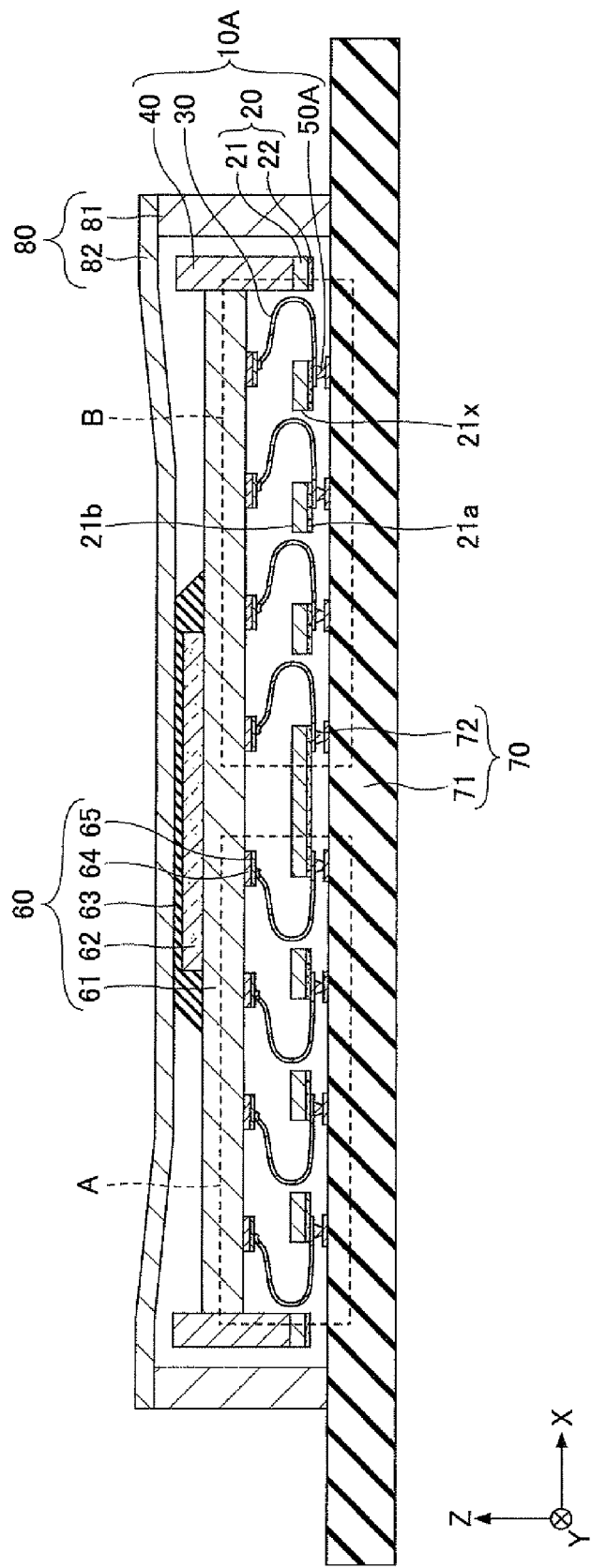
FIG. 19 is a cross sectional view illustrating an example of a socket in a second modification of the first embodiment.
Figure 21A:
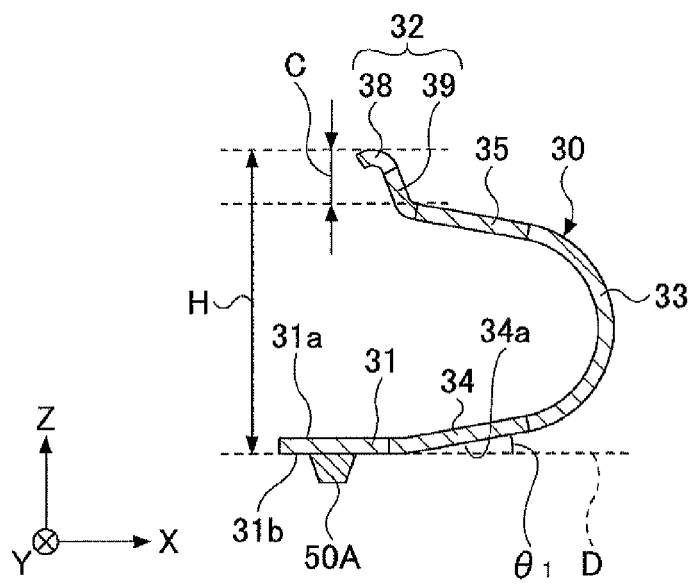
FIG. 21A is a cross sectional view illustrating connecting terminals in the second modification of the first embodiment.
Figure 21B:
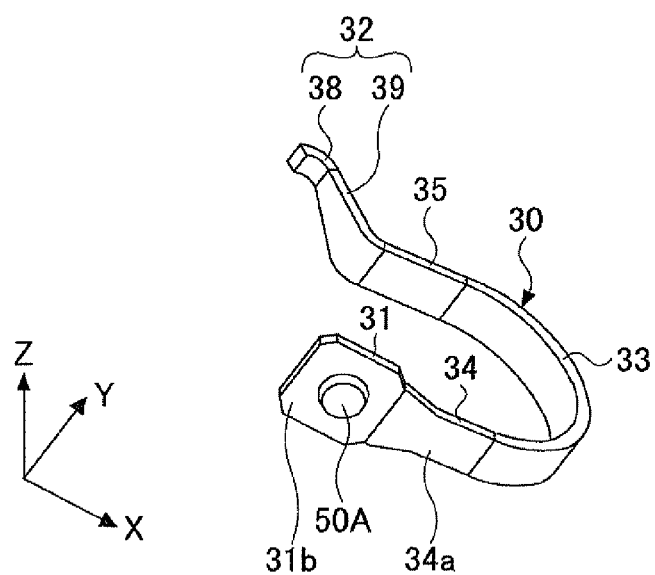
FIG. 21B is a perspective view illustrating the connecting terminals in the second modification of the first embodiment.

FIG. 19 is a cross sectional view illustrating an example of a socket in this second modification of the first embodiment. FIG. 20 is a cross sectional view illustrating a part of the socket illustrated in FIG. 19 on an enlarged scale. FIG. 21A is a cross sectional view illustrating connecting terminals in this second modification of the first embodiment, and FIG. 21B is a perspective view illustrating the connecting terminals in this second modification of the first embodiment. As illustrated in FIGS. 19, 20, 21A and 21B, a socket 10A differs from the socket 10 of the first embodiment illustrated in FIGS. 4 and 5 in that the bumps 50 are replaced by the bumps 50A. A description of those parts of the second modification that are the same as those corresponding parts of the first embodiment will be omitted.

The bump 50A is formed by a projecting part provided on the surface 31b of the first connecting part 31. The bump 50A makes contact with and electrically connects to the conductor layer 72 of the circuit board 70, however, the bump 50A is not fixed to the conductor layer 72. In other words, the bump 50A makes contact with the conductor layer 72 of the circuit board 70 in the state in which the bump 50A may separate from (that is, not fixed to) the conductor layer 72. By releasing the lock with respect to the lid member 82, not only the semiconductor package 60 but also the socket 10A may be removed from the circuit board 70. By making the socket 10A detachable with respect to the circuit board 70, the socket 10A may easily be replaced when the connecting terminal 30 is damaged, for example.

The bump 50A may be integrally formed on the surface 31b of the first connecting part 31 or, may be a separate piece bonded to the surface 31b of the first connecting part 31. The bump 50A may have a truncated cone shape having a diameter that is larger at the surface 31b than at a tip end thereof. Of course, the shape of the bump 50A is not limited to the truncated cone shape, and may be a hemispherical shape, a cylindrical shape, an oval column shape, and the like. A projecting amount of the bump 50A from the surface 31b may be on the order of 0.3 mm to 0.4 mm, for example.

The bump 50A may be formed in the process of forming the connecting terminal 30 of the first embodiment, simultaneously as the pressing (punching) of the metal plate (for example, a Cu alloy) by diecutting. In addition, the bump 50A may be formed in the process of forming the connecting terminal 30 of the first embodiment, after the pressing (punching) of the metal plate (for example, a Cu alloy) by diecutting, by plating or wire-bonding on the surface 31b of the first connecting part 31. In this case, materials such as Au, Ag and Cu may be used for the bump 50A.

According to this second modification of the first embodiment, it is possible to obtain effects similar to those obtainable by the first embodiment. In addition, because the bump is provided on the surface of the first connecting part and makes contact with the conductor layer of the circuit board in the state in which the bump may separate from (that is, not fixed to) the conductor layer, the socket is detachable from the circuit board. As a result, it is possible to easily replace the socket even if the connecting terminal thereof is damaged.

The bump 50A may be provided on the circuit board 70. In this case, the bump 50A is provided on the conductor layer 72 of the circuit board 70, and the surface 31b of the first connecting part 31 makes contact with and is electrically connected to the bump 50A provided on the conductor layer 72 in a state in which the surface 31b is separable from (not fixed to) the bump 50A. The effects obtainable in this case are similar to the effects obtainable when the bump 50A is provided on the surface 31b of the first connecting part 31.

[Third Modification of First Embodiment]

In the first embodiment, the bump 50 is provided on the surface 31b of the first connecting part 31 of the connecting terminal 30, as illustrated in FIGS. 4 and 5. But in a third modification of the first embodiment, a projecting part 51 is provided on the surface 31b of the first connecting part 31 of the connecting terminal 30, and a bump 50B is formed by a bonding part 52 provided on the surface 31b of the first connecting part 31 including the projecting part 51.

Figure 22:
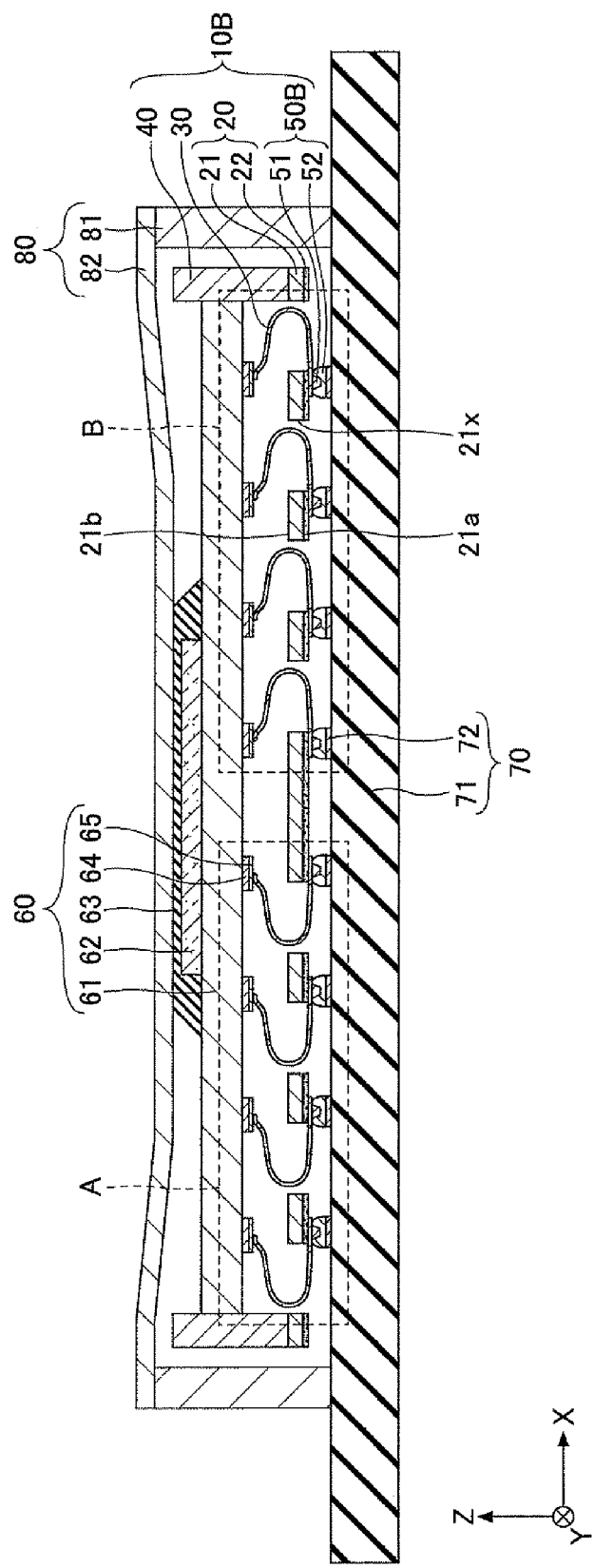
FIG. 22 is a cross sectional view illustrating an example of a socket in a third modification of the first embodiment.
Figure 23:
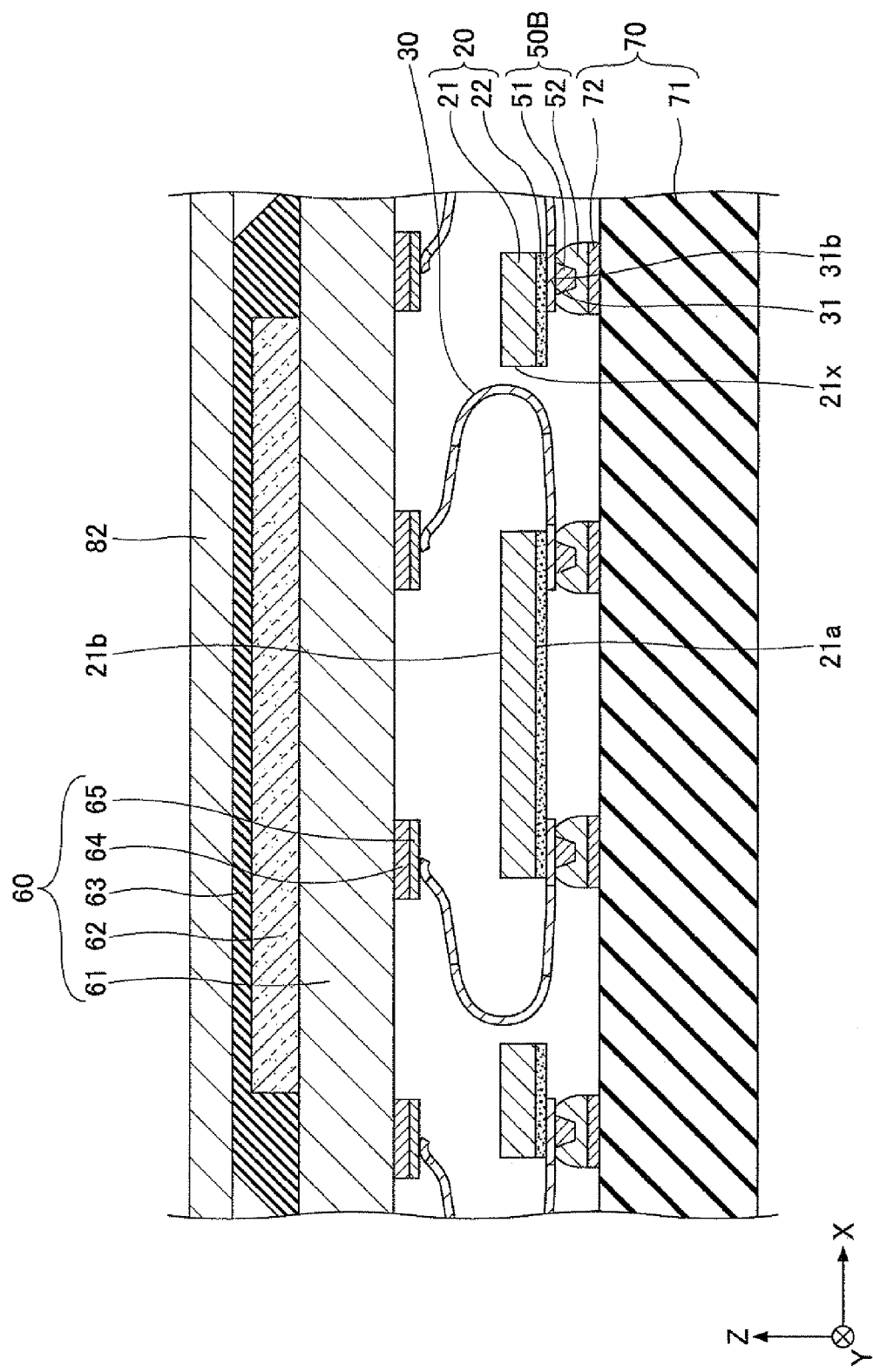
FIG. 23 is a cross sectional view illustrating a part of the socket illustrated in FIG. 22 on an enlarged scale.

FIG. 22 is a cross sectional view illustrating an example of a socket in a third modification of the first embodiment, and FIG. 23 is a cross sectional view illustrating a part of the socket illustrated in FIG. 22 on an enlarged scale. A description of those parts of the third modification that are the same as those corresponding parts of the first embodiment will be omitted.

The bump 50B includes the projecting part 51 and the bonding part 52. The projecting part 51 is formed on the surface 31b of the first connecting part 31. The projecting part 51 may be the same as the bump 50A of the second modification of the first embodiment described above. Hence, a detailed description of the projecting part 51 will be omitted.

The bonding part 52 is formed on the surface 31b of the first connecting part 31 and covers the projecting part 51. The bonding part 52 bonds and electrically connects the surface 31b of the first connecting part 31, including the projecting part 51, to the conductor layer 72 of the circuit board 70. For example, the bonding part 52 may be formed by solder. The solder material may be an alloy including Pb, or a Pb-free solder such as an alloy of Sn and Cu, an alloy of Sn and Ag, and an alloy of Sn, Ag and Cu. Instead of using the solder, the bonding part 52 may be formed by a conductive resin bonding agent (or adhesive agent), such as Ag paste.

According to this third modification of the first embodiment, it is possible to obtain effects similar to those obtainable by the first embodiment. In addition, because the bump includes the projecting part formed on the surface of the first connecting part and the bonding part covering the projecting part, the bonding part may make contact with the surface of the first connecting part including the projecting part in an area that is larger than that for the case in which the bump (connecting part) is provided on the surface of the first connecting part having no projecting part. As a result, the adhesion between the connecting terminal and the bump may be improved. Further, the resistance between the connecting terminal and the bump may be reduced.

[Fourth Modification of First Embodiment]

In the first embodiment, the positioning part 40 is provided on the support member 20, and the semiconductor package 60 is positioned by the positioning part 40. But in a fourth modification of the first embodiment, no positioning part 40 is provided on the support member 20, and instead, a frame part of a housing is provided with a positioning function in order to position the semiconductor package 60.

Figure 24:
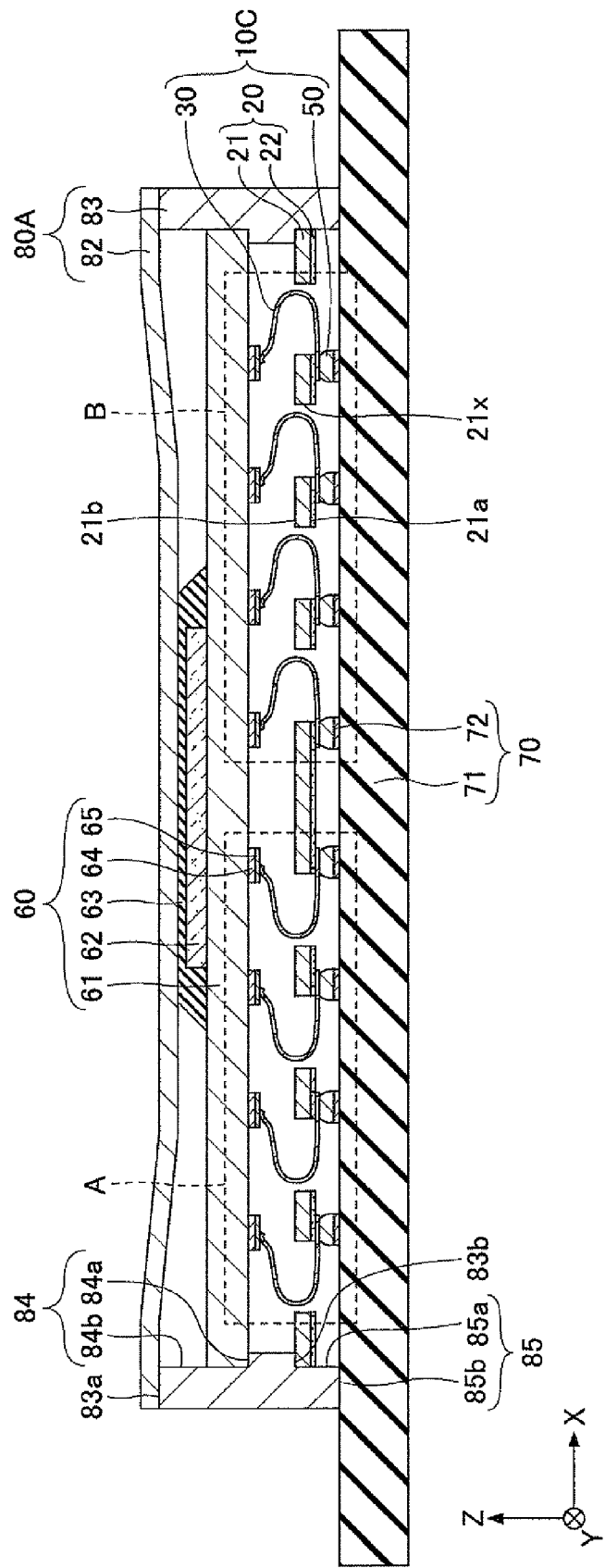
FIG. 24 is a cross sectional view illustrating an example of a socket in a fourth modification of the first embodiment.

FIG. 24 is a cross sectional view illustrating an example of a socket in the fourth modification of the first embodiment. As illustrated in FIG. 24, no positioning part 40 is provided on the support member 20 of a socket 10C, and instead, a frame part 83 of a housing 80A positions the semiconductor package 60, unlike the socket 10 of the first embodiment illustrated in FIGS. 4 and 5. A description of those parts of the fourth modification that are the same as those corresponding parts of the first embodiment will be omitted.

Figure 25A:
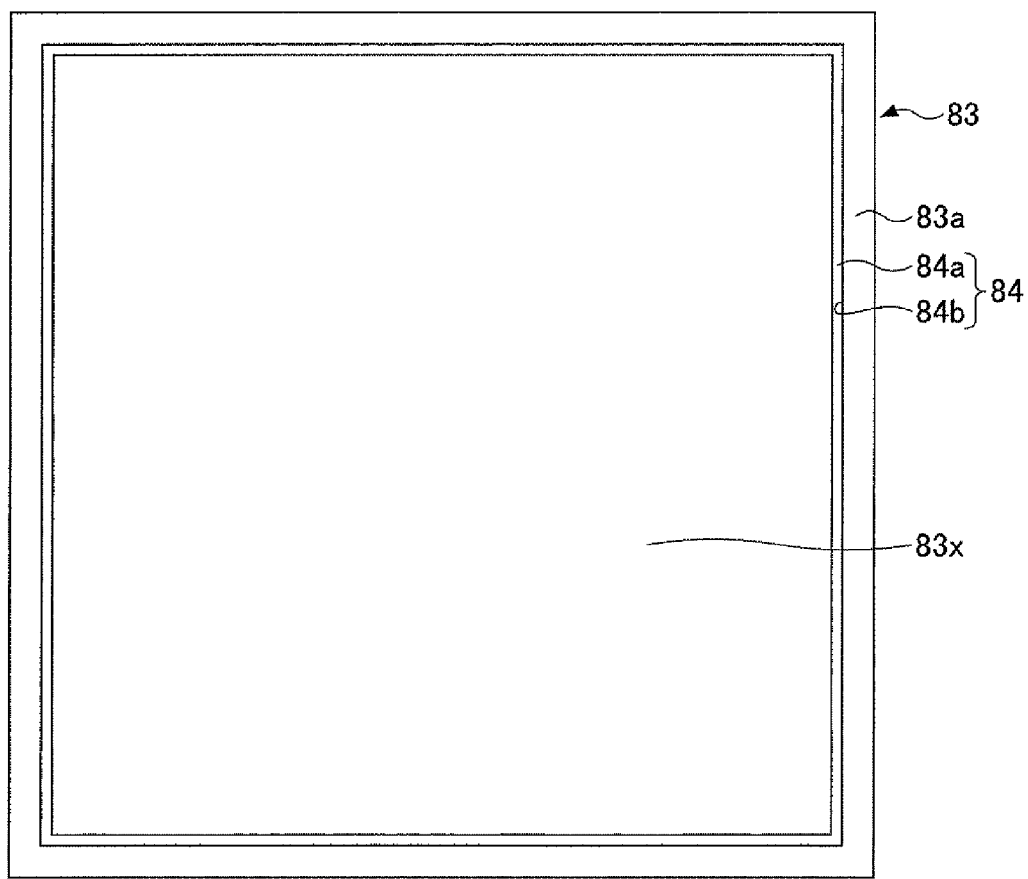
FIG. 25A is a plan view illustrating an example of a frame part of a housing in the fourth modification of the first embodiment.
Figure 25B:
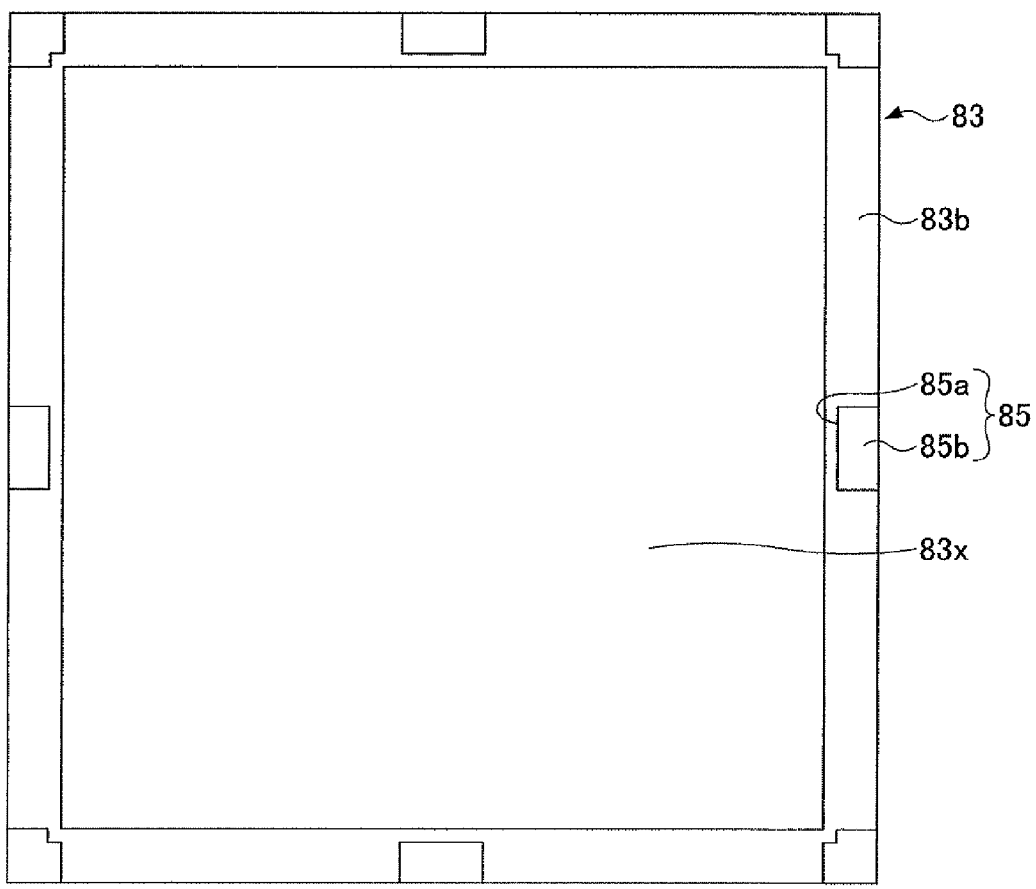
FIG. 25B is a bottom view illustrating the example of the frame part of the housing in the fourth modification of the first embodiment.
Figure 25C:
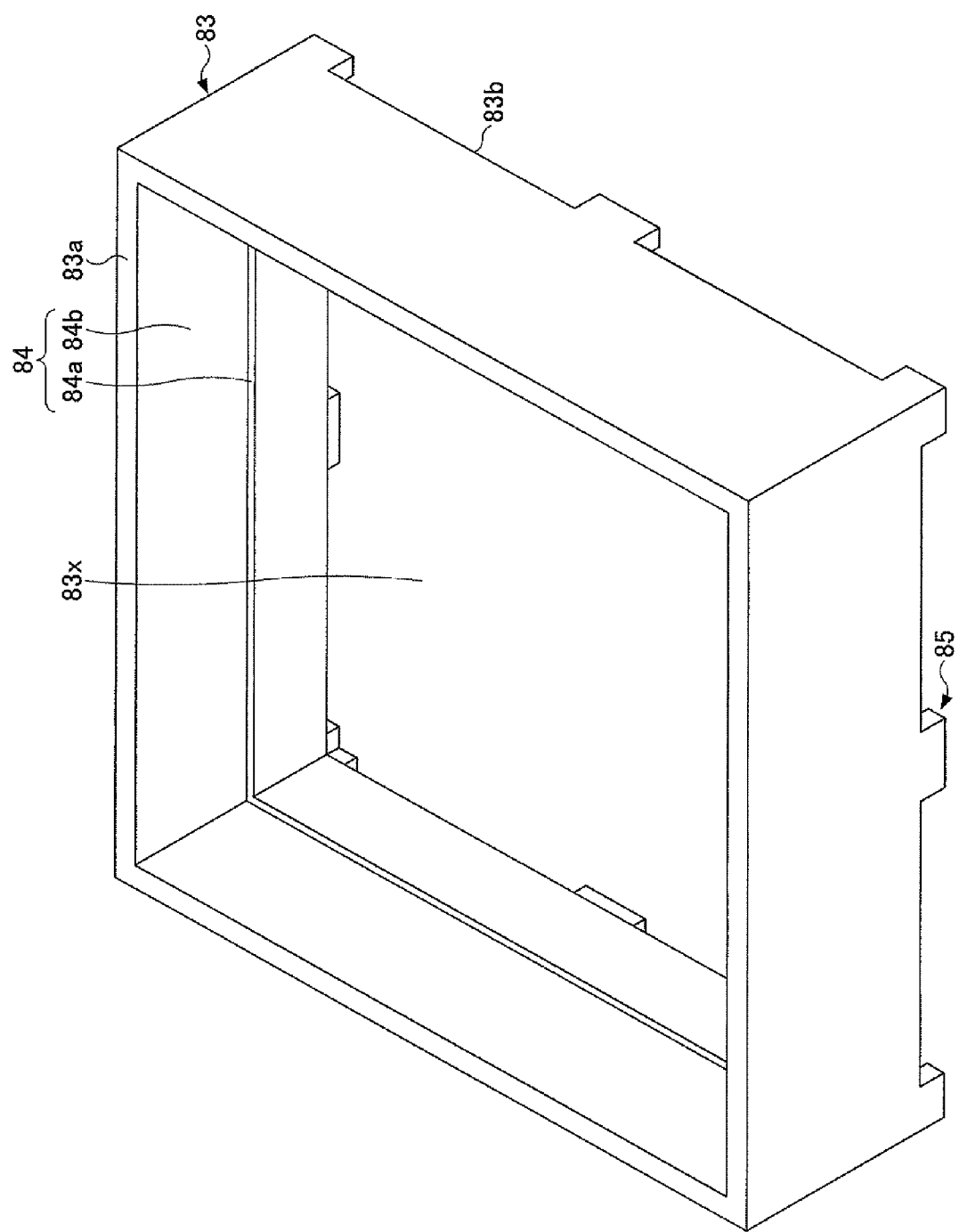
FIG. 25C is a perspective view illustrating the example of the frame part of the housing in the fourth modification of the first embodiment.

FIG. 25A is a plan view illustrating an example of the frame part of the housing in the fourth modification of the first embodiment, FIG. 25B is a bottom view illustrating the example of the frame part of the housing in the fourth modification of the first embodiment, and FIG. 25C is a perspective view illustrating the example of the frame part of the housing in the fourth modification of the first embodiment. As illustrated in FIGS. 25A through 25C, the frame part 83 has a frame shape with a rectangular opening 83x in a center thereof, and includes a first positioning and holding part 84 and a second positioning and holding part 85. The frame part 83 may be made of a resin, a metal, and the like. The frame part 83 has a function to position and hold the semiconductor package 60 and the support member 20, and to align the positions (perform position alignment) of the semiconductor package 60 and the support member 20. In addition, the frame part 83 also has a function to prevent a gap between the semiconductor package 60 and the support member 20 from becoming a predetermined value or less.

The first positioning and holding part 84 includes a surface 84a and a surface 84b. The surface 84a is provided in a frame shape approximately parallel to a top surface 83a of the frame part 83, at a position on the inner side of and one level lower than the top surface 83a. The surface 84a is provided approximately perpendicularly to the top surface 83a, between the surface 84a and the top surface 83a, to form a part of the inner surface of the frame part 83.

The surface 84a makes contact with the outer peripheral part on the lower surface of the substrate 61 forming the semiconductor package 60. An opening defined by the surface 84b is rectangular in order to match the planar shape of the semiconductor package 60. In addition, the shape of the opening defined by the surface 84b is slightly larger than the external shape of the substrate 61, in order to facilitate the mounting (or attachment) and removal of the semiconductor package 60. The surface 84b and the side surface of the substrate 61 may be in contact with each other. Alternatively, a gap may exist between the surface 84b and the side surface of the substrate 61 as long as no positional error is introduced between the other end of each connecting terminal 30 of the socket 10C and the corresponding noble metal layer 65 of the semiconductor package 60.

Because the semiconductor package 60 is held by the first positioning and holding part 84, the semiconductor package 60 will not be pushed further towards the circuit board 70 than the surface 84a of the first positioning and holding part 84. As a result, the connecting terminal 30 may be prevented from being excessively deformed and damaged due to an excessive insertion of the semiconductor package 60 towards the circuit board 70.

The second positioning and holding part 85 is formed by a plurality of projecting parts projecting from a lower surface 83b of the frame part 83 at the outer peripheral part of the lower surface 83b. The second positioning and holding part 85 includes an inner side surface 85a and a bottom surface 85b. The support member 20 of the socket 100 is press-fit into the second positioning and holding part 85 (projecting parts), and the lower surface 83b of the frame part 83 and the inner side surface 85a of the second positioning and holding part 85 respectively make contact with the outer peripheral part of the top surface and the side surface of the support member 20.

An opening defined by the inner side surface 85a has a rectangular shape to match the planar shape of the support member 20. In addition, the shape of the opening defined by the inner side surface 85a approximately matches the external shape of the support member 20 in order to enable the press-fitting of the support member 20 into this opening. The height from the bottom surface 85b of the second positioning and holding part 85 to the lower surface 83b of the frame part 83 is approximately the same as the height from the top surface of the circuit board 70 to the top surface of the support member 20, and the bottom surface 85b of the second positioning and holding part 85 makes contact with the top surface of the circuit board 70.

The frame part 83 is not fixed to the circuit board 70. However, the socket 100 is fixed to the circuit board 70 by the bumps 50. For this reason, the frame part 83 having the support member 20 press-fit therein is indirectly fixed to the circuit board 70. Instead of indirectly fixing the frame part 83 to the circuit board 70 by press-fitting the support member 20 into the frame part 83, the frame part 83 may of course be fixed to the top surface of the circuit board 70 using bolts or the like that penetrate the circuit board 70.

According to this fourth modification of the first embodiment, it is possible to obtain effects similar to those obtainable by the first embodiment. In addition, because the frame part of the housing has the positioning function, the semiconductor package may be positioned without having to provide a positioning part on the support member.

In addition, because the gap between the semiconductor package and the support member will not become the predetermined value or less, the semiconductor package will not be pushed excessively towards the circuit board, to thereby prevent excessive deformation and damage of the connecting terminal.

[Fifth Modification of First Embodiment]

In a fifth modification of the first embodiment, the connecting terminals have a shape different from that of the first embodiment.

Figure 26:
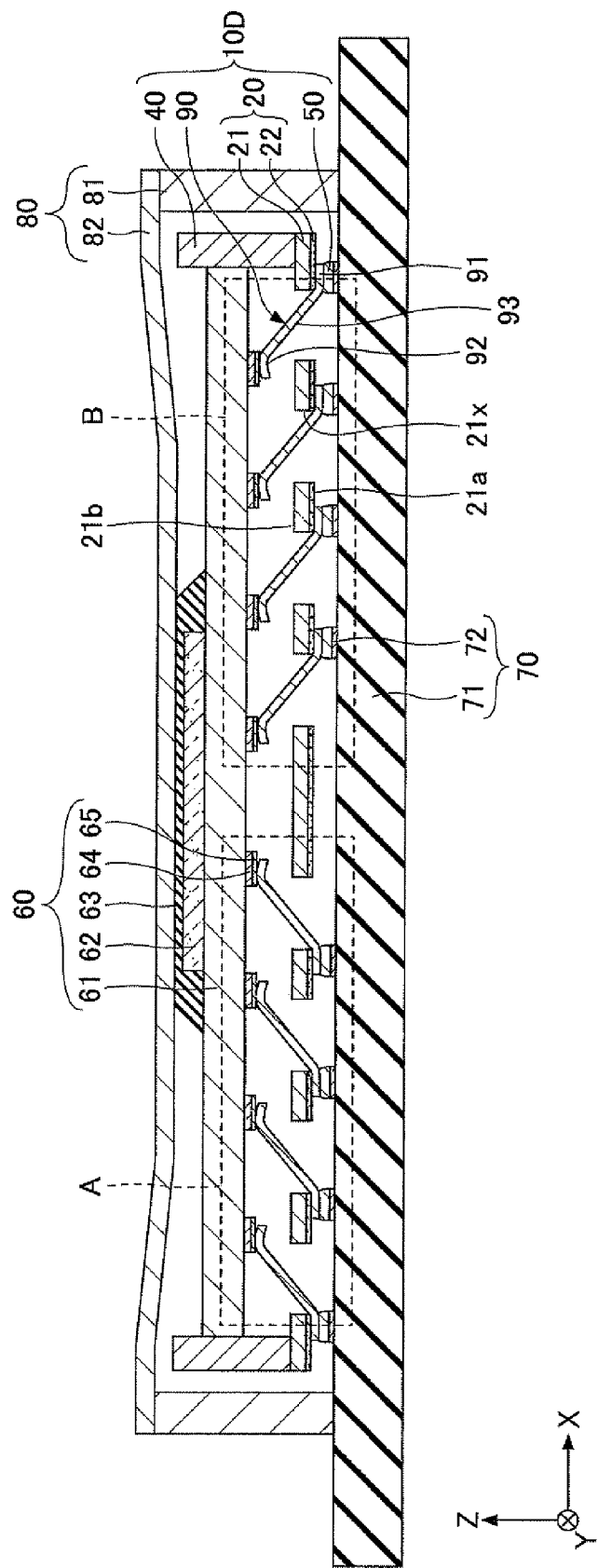
FIG. 26 is a cross sectional view illustrating an example of a socket in a fifth modification of the first embodiment.

FIG. 26 is a cross sectional view illustrating an example of a socket in the fifth modification of the first embodiment. As illustrated in FIG. 26, the connecting terminals 30 of the socket 10 of the first embodiment illustrated in FIGS. 4 and 5 are replaced by connecting terminals 90 in a socket 10D. A description of those parts of the fifth modification that are the same as those corresponding parts of the first embodiment will be omitted.

The connecting terminal 90 is conductive and has a spring property. The connecting terminal 90 is inserted into the penetrating hole 21x in the main body 21, and a first connecting part 91 provided on one end of the connecting terminal 90 is fixed to the surface 21a of the main body 21 via the bonding layer 22. In addition, a second connecting part 92 provided on the other end of the connecting terminal 90 projects from the surface 21b of the main body 21.

The first connecting part 91 has a plate shape that is similar to the first connecting part 31. The second connecting part 92 has a round or rounded shape that is similar to the contact part 38 of the second connecting part 32. A spring part 93 is arranged between the first connecting part 91 and the second connecting part 92, and is integrally formed on the first connecting part 91 and the second connecting part 92. The thicknesses of the first connecting part 91 and the second connecting part 92 and the entire height of the connecting terminal 90 may be the same or approximately the same as those of the connecting terminal 30 described above.

The connecting terminal 90 is inserted into the penetrating hole 21x in a state in which the connecting terminal 90 may function as a spring. In other words, the part of the connecting terminal 90 inserted into the penetrating hole 21x is not fixed to the inner wall surface defining the penetrating hole 21x, and is resiliently deformable. For this reason, approximately the entire connecting terminal 90, including the part inserted into the penetrating hole 21x (excluding the first connecting part 91), may function as a spring.

One end of the connecting terminal 90 (surface of the first connecting part 91 opposing the circuit board 70) is bonded to and is electrically connected to the conductor layer 72 of the circuit board 70 via the bump 50. The other end of the connecting terminal 90 (second connecting part 92) makes contact with and is electrically connected to the noble metal layer 65 of the semiconductor package 60 in a state in which this other end of the connecting terminal 90 is separable from (that is, not fixed to) the noble metal layer 65.

For reasons similar to those described above with respect to the first embodiment, the connecting terminal 90 arranged in a region A illustrated in FIG. 26 and the connecting terminal 90 arranged in a region B illustrated in FIG. 26 are arranged symmetrically to oppose each other. However, the connecting terminals 90 in the region A and the connecting terminals 90 in the region B may be oriented to face the same direction.

By fixing (or locking) the outer peripheral part of the lid part 82 to the top surface of the frame part 81, the lid part 82 pushes the semiconductor package 60 towards the circuit board 70 and moves the semiconductor package 60 towards the circuit board 70. Accordingly, the connecting terminal 90 of the socket 10D is pushed and compressed in the Z-axis direction, to generate a predetermined spring force. In addition, the noble metal layer 65 of the semiconductor package 60 makes contact with the other end of the connecting terminal 90 (second connecting part 92). In other words, the semiconductor package 60 is electrically connected to the circuit board 70 via the socket 10D. By unlocking or releasing the lid part 82, the semiconductor package 60 becomes removable from the socket 10D. In other words, the semiconductor package 60 is detachably connected to the socket 10D, such that the semiconductor package 60 is attachable to and is detachable from the socket 10D. Effects similar to those obtainable in the first embodiment may be obtained in this fifth modification of the first embodiment.

Therefore, the connecting terminal is not limited to the shape of the connecting terminal 30, and may have other shapes, such as the shape of the connecting terminal 90 of the fifth modification of the first embodiment. In other words, the shape of the connecting terminal is arbitrary as long as the connecting terminal may be inserted into the penetrating hole of the support member in a state in which the connecting terminal is not fixed to the inner wall surface defining the penetrating hole and may function as a spring, that is, one end of the connecting terminal is fixed to one surface of the support member and the other end of the connecting terminal projects from the other surface of the support member.

For example, one connecting terminal is inserted into one penetrating hole in the embodiment and modifications described above. However, a plurality of connecting terminals may be inserted into one penetrating hole, and the first connecting part of each of these connecting terminals may be fixed to one surface of the support member.

In addition, in a second embodiment of the present invention, at least one of the second through fourth modifications of the first embodiment may be applied with respect to the fifth modification of the first embodiment.

Further, although the socket is applied to the circuit board, such as the mother board, in each of the embodiments and modifications described above, the disclosed socket may be applied to a semiconductor package testing board and the like. For example, by applying the disclosed socket to the semiconductor package testing board, a test on electrical characteristic or the like of the semiconductor package may be performed repeatedly.

Although the embodiments are numbered with, for example, "first," "second," or "third," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contribute by the inventor to furthering the art, and are to be construed as being without limitation to such specifically recited examples and conditions, nor does the organization of such examples in the specification related to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A socket to detachably connect a connecting item to a substrate that has a substrate surface, said socket comprising:
    a plurality of connecting terminals configured to electrically connect the connecting item and the substrate;
    a support member including a first surface and a second surface and configured to fix the plurality of connecting terminals; and
    a plurality of penetrating holes formed in the support member,
    wherein each of the plurality of connecting terminals includes a first connecting part formed on one end thereof, a second connecting part formed on another end thereof, and a U-shaped part provided between the first and second connecting parts,
    wherein each of the plurality of connecting terminals is inserted into a corresponding one of the plurality of penetrating holes in a state in which the first connecting part is fixed to the first surface of the support member and the second connecting part projects from the second surface of the support member, and
    wherein, in a state in which the connecting item and the substrate are connected via the socket, the first and second connecting parts of each of the plurality of connecting terminals are substantially aligned along a single direction perpendicular to the substrate surface.

2. The socket as claimed in claim 1, wherein the first connecting part includes a third surface fixed to the first surface of the support member, a fourth surface opposite to the third surface and configured to electrically connect to the substrate.

3. The socket as claimed in claim 2, further comprising:
    a bump formed on the fourth surface and configured to bond to a pad of the substrate in order to electrically connect the first connecting part and the pad on the substrate surface.

4. The socket as claimed in claim 2, further comprising:
    a bump formed on the fourth surface and configured to make contact with a pad of the substrate surface in order to electrically connect the first connecting part and the pad on the substrate surface.

5. The socket as claimed in claim 2, further comprising:
    a bump formed on the fourth surface, and including a projecting part formed on the fourth surface and a bonding part formed on the fourth surface and covering the projecting part,
    wherein the bonding part is configured to bond to a pad of the substrate surface in order to electrically connect the first connecting part and the pad on the substrate surface.

6. The socket as claimed in claim 1, wherein each of the plurality of connecting terminals is inserted into the corresponding one of the plurality of penetrating holes in a state making no contact with an inner wall surface defining the penetrating hole of the support member.

7. The socket as claimed in claim 1, further comprising:
    a positioning part, provided on an outer peripheral part on the second surface of the support member, and configured to position the second connecting part with respect to a pad of the connecting item.

8. The socket as claimed in claim 1, wherein the connecting item is formed by a semiconductor package, and the substrate is formed by a circuit board.

9. The socket as claimed in claim 2, wherein the first connecting part further includes a projecting part projecting from the fourth surface towards the substrate.

10. The socket as claimed in claim 1, wherein each of the plurality of connecting terminals is oriented at an angle greater than 0 degrees with respect to a direction in which the plurality of connecting terminals are arranged in a plan view of the substrate surface.

11. The socket as claimed in claim 10, wherein the angle is in a range of 25 degrees to 35 degrees.

* * * * *

UNITED STATES PATENT AND TRADEMARK OFFICE
CERTIFICATE OF CORRECTION

PATENT NO.       : 8,419,442 B2
APPLICATION NO.  : 13/183975
DATED            : April 16, 2013
INVENTOR(S)      : Yasuyoshi Horikawa et al.

It is certified that error appears in the above-identified patent and that said Letters Patent is hereby corrected as shown below:

Title page, item [73], Assignee's address should read "TOKYO, JAPAN"

Signed and Sealed this
Twenty-fourth Day of September, 2013

Teresa Stanek Rea
*Deputy Director of the United States Patent and Trademark Office*

UNITED STATES PATENT AND TRADEMARK OFFICE
CERTIFICATE OF CORRECTION

PATENT NO. : 8,419,442 B2  
APPLICATION NO. : 13/183975  
DATED : April 16, 2013  
INVENTOR(S) : Yasuyoshi Horikawa et al.

Page 1 of 1

It is certified that error appears in the above-identified patent and that said Letters Patent is hereby corrected as shown below:

Title page, item [73], Assignee's address should read "NAGANO, JAPAN"

This certificate supersedes the Certificate of Correction issued September 24, 2013.

Signed and Sealed this  
Nineteenth Day of November, 2013

Teresa Stanek Rea  
*Deputy Director of the United States Patent and Trademark Office*